(12) United States Patent
Pan

(10) Patent No.: US 11,462,291 B2
(45) Date of Patent: Oct. 4, 2022

(54) APPARATUSES AND METHODS FOR TRACKING WORD LINE ACCESSES

(71) Applicant: MICRON TECHNOLOGY, INC., Boise, ID (US)

(72) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/102,266

(22) Filed: Nov. 23, 2020

(65) Prior Publication Data
US 2022/0165347 A1    May 26, 2022

(51) Int. Cl.
| | | |
|---|---|---|
| *G11C 29/42* | (2006.01) | |
| *G11C 29/44* | (2006.01) | |
| *G11C 11/406* | (2006.01) | |
| *G11C 7/06* | (2006.01) | |
| *G11C 29/20* | (2006.01) | |
| *G11C 29/12* | (2006.01) | |

(52) U.S. Cl.
CPC .............. *G11C 29/42* (2013.01); *G11C 7/065* (2013.01); *G11C 11/40611* (2013.01); *G11C 29/20* (2013.01); *G11C 29/44* (2013.01); *G11C 2029/1202* (2013.01)

(58) Field of Classification Search
None
See application file for complete search history.

(56) References Cited

U.S. PATENT DOCUMENTS

| | | |
|---|---|---|
| 1,158,364 A | 10/1915 | Bibb |
| 3,633,175 A | 1/1972 | Harper |
| 5,291,198 A | 3/1994 | Dingwall et al. |
| 5,299,159 A | 3/1994 | Balistreri et al. |
| 5,422,850 A | 6/1995 | Sukegawa et al. |
| 5,638,317 A | 6/1997 | Tran |
| 5,699,297 A | 12/1997 | Yamazaki et al. |

(Continued)

FOREIGN PATENT DOCUMENTS

| | | |
|---|---|---|
| CN | 1195173 A | 10/1998 |
| CN | 101038785 A | 9/2007 |

(Continued)

OTHER PUBLICATIONS

US 11,264,075 B2, 03/2022, Bell et al. (withdrawn)

(Continued)

*Primary Examiner* — J. H. Hur
(74) *Attorney, Agent, or Firm* — Dorsey & Whitney LLP

(57) ABSTRACT

Counters may be provided for individual word lines of a memory for tracking word line accesses. In some examples, multiple counters may be provided for individual word lines. In some examples, the counters may be included on the word lines. The counters may be incremented responsive to word line accesses in some examples. In some examples, the counters may be incremented responsive for a time period for which a word line is held open. In some examples, the counters may be incremented responsive to both word line accesses and time periods for which the word line is held open. In some examples, count values for the counters may be written back to the counters after incrementing. In some examples, the count values may be written back prior to receiving a precharge command.

16 Claims, 6 Drawing Sheets

(56) References Cited

U.S. PATENT DOCUMENTS

| | | |
|---|---|---|
| 5,768,196 A | 6/1998 | Bloker et al. |
| 5,933,377 A | 8/1999 | Hidaka |
| 5,943,283 A | 8/1999 | Wong et al. |
| 5,999,471 A | 12/1999 | Choi |
| 6,002,629 A | 12/1999 | Kim et al. |
| 6,011,734 A | 1/2000 | Pappert |
| 6,061,290 A | 5/2000 | Shirley |
| 6,212,118 B1 | 4/2001 | Fujita |
| 6,310,806 B1 | 10/2001 | Higashi et al. |
| 6,317,381 B1 | 11/2001 | Gans et al. |
| 6,373,738 B1 | 4/2002 | Towler et al. |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,480,931 B1 | 11/2002 | Buti et al. |
| 6,515,928 B2 | 2/2003 | Sato et al. |
| 6,567,340 B1 | 5/2003 | Nataraj et al. |
| 6,950,364 B2 | 9/2005 | Kim |
| 7,027,343 B2 | 4/2006 | Sinha et al. |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,283,380 B1 | 10/2007 | Srinivasan et al. |
| 7,319,602 B1 | 1/2008 | Srinivasan et al. |
| 7,444,577 B2 | 10/2008 | Best et al. |
| 7,551,502 B2 | 6/2009 | Dono et al. |
| 7,565,479 B2 | 7/2009 | Best et al. |
| 7,830,742 B2 | 11/2010 | Han |
| 8,174,921 B2 | 5/2012 | Kim et al. |
| 8,400,805 B2 | 3/2013 | Yoko |
| 8,451,677 B2 | 5/2013 | Okahiro et al. |
| 8,625,360 B2 | 1/2014 | Iwamoto et al. |
| 8,676,725 B1 | 3/2014 | Lin et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,058,900 B2 | 6/2015 | Kang |
| 9,087,554 B1 | 7/2015 | Park |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,251,885 B2 | 2/2016 | Greenfield et al. |
| 9,286,964 B2 | 3/2016 | Halbert et al. |
| 9,299,457 B2 | 3/2016 | Chun et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,412,432 B2 | 8/2016 | Narui et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,646,672 B1 | 5/2017 | Kim et al. |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,818,469 B1 | 11/2017 | Kim et al. |
| 9,847,118 B1 | 12/2017 | Won |
| 9,865,326 B2 | 1/2018 | Bains et al. |
| 9,865,328 B1 | 1/2018 | Desimone et al. |
| 9,922,694 B2 | 3/2018 | Akamatsu |
| 9,934,143 B2 | 4/2018 | Bains et al. |
| 9,953,696 B2 | 4/2018 | Kim |
| 10,032,501 B2 | 7/2018 | Ito et al. |
| 10,083,737 B2 | 9/2018 | Bains et al. |
| 10,090,038 B2 | 10/2018 | Shin |
| 10,134,461 B2 | 11/2018 | Bell et al. |
| 10,147,472 B2 | 12/2018 | Jones et al. |
| 10,153,031 B2 | 12/2018 | Akamatsu |
| 10,170,174 B1 | 1/2019 | Ito et al. |
| 10,176,860 B1 | 1/2019 | Mylavarapu |
| 10,210,925 B2 | 2/2019 | Bains et al. |
| 10,297,305 B1 | 5/2019 | Moon et al. |
| 10,339,994 B2 | 7/2019 | Ito et al. |
| 10,381,327 B2 | 8/2019 | Ramachandra et al. |
| 10,387,276 B2 | 8/2019 | Ryu et al. |
| 10,446,216 B2 | 10/2019 | Oh et al. |
| 10,490,251 B2 | 11/2019 | Wolff |
| 10,600,462 B2 | 3/2020 | Augustine et al. |
| 10,600,491 B2 | 3/2020 | Chou et al. |
| 10,607,686 B2 | 3/2020 | Akamatsu |
| 10,629,286 B2 | 4/2020 | Lee et al. |
| 10,679,710 B2 | 6/2020 | Hirashima et al. |
| 10,705,900 B2 | 7/2020 | Jin |
| 10,770,127 B2 | 9/2020 | Shore et al. |
| 10,811,066 B2 | 10/2020 | Jones et al. |
| 10,832,792 B1 | 11/2020 | Penney et al. |
| 10,861,519 B2 | 12/2020 | Jones et al. |
| 10,867,660 B2 | 12/2020 | Akamatsu |
| 10,930,335 B2 | 2/2021 | Bell et al. |
| 10,943,636 B1 | 3/2021 | Wu et al. |
| 10,950,289 B2 | 3/2021 | Ito et al. |
| 10,964,378 B2 | 3/2021 | Ayyapureddi et al. |
| 11,011,215 B1 | 5/2021 | Parry et al. |
| 11,043,254 B2 | 6/2021 | Enomoto et al. |
| 11,139,015 B2 | 10/2021 | Brown et al. |
| 11,152,050 B2 | 10/2021 | Morohashi et al. |
| 11,158,364 B2 | 10/2021 | Penney et al. |
| 11,158,373 B2 | 10/2021 | Penney et al. |
| 11,200,942 B2 | 12/2021 | Jenkinson et al. |
| 11,222,682 B1 | 1/2022 | Enomoto et al. |
| 11,257,535 B2 | 2/2022 | Shore et al. |
| 11,264,096 B2 | 3/2022 | Schreck et al. |
| 11,322,192 B2 | 5/2022 | Morohashi et al. |
| 2001/0008498 A1 | 7/2001 | Ooishi |
| 2002/0007476 A1* | 1/2002 | Kishino ............... G06F 11/1028 714/763 |
| 2002/0078311 A1 | 6/2002 | Matsuzaki et al. |
| 2002/0080677 A1 | 6/2002 | Watanabe et al. |
| 2002/0181301 A1 | 12/2002 | Takahashi et al. |
| 2003/0063512 A1 | 4/2003 | Takahashi et al. |
| 2003/0067825 A1 | 4/2003 | Shimano et al. |
| 2003/0090400 A1 | 5/2003 | Barker |
| 2003/0123301 A1 | 7/2003 | Jang et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0052142 A1 | 3/2004 | Ikehashi et al. |
| 2004/0114446 A1 | 6/2004 | Takahashi et al. |
| 2004/0130959 A1 | 7/2004 | Kawaguchi |
| 2004/0174757 A1 | 9/2004 | Garverick et al. |
| 2004/0184323 A1 | 9/2004 | Mori et al. |
| 2004/0213035 A1* | 10/2004 | Cavaleri ............ G11C 16/3418 365/154 |
| 2004/0218431 A1 | 11/2004 | Chung et al. |
| 2005/0041502 A1 | 2/2005 | Perner |
| 2005/0105315 A1 | 5/2005 | Shin et al. |
| 2005/0243629 A1 | 11/2005 | Lee |
| 2005/0265104 A1 | 12/2005 | Remaklus et al. |

(56) References Cited

U.S. PATENT DOCUMENTS

| | | |
|---|---|---|
| 2006/0083099 A1 | 4/2006 | Bae et al. |
| 2006/0087903 A1 | 4/2006 | Riho et al. |
| 2006/0176744 A1 | 8/2006 | Stave |
| 2006/0262616 A1 | 11/2006 | Chen |
| 2007/0008799 A1 | 1/2007 | Dono et al. |
| 2007/0014174 A1 | 1/2007 | Ohsawa |
| 2007/0028068 A1 | 2/2007 | Golding et al. |
| 2007/0030746 A1 | 2/2007 | Best et al. |
| 2007/0033339 A1 | 2/2007 | Best et al. |
| 2007/0133330 A1 | 6/2007 | Ohsawa |
| 2007/0230264 A1* | 10/2007 | Eto ............ G11C 11/40603 365/222 |
| 2007/0237016 A1 | 10/2007 | Miyamoto et al. |
| 2007/0297252 A1 | 12/2007 | Singh |
| 2008/0028260 A1 | 1/2008 | Oyagi et al. |
| 2008/0031068 A1 | 2/2008 | Yoo et al. |
| 2008/0062742 A1 | 3/2008 | Wang |
| 2008/0126893 A1 | 5/2008 | Harrand et al. |
| 2008/0130394 A1 | 6/2008 | Dono et al. |
| 2008/0181048 A1 | 7/2008 | Han |
| 2008/0224742 A1 | 9/2008 | Pomichter |
| 2008/0253212 A1 | 10/2008 | Iida et al. |
| 2008/0266990 A1 | 10/2008 | Loeffler |
| 2008/0288720 A1 | 11/2008 | Atwal et al. |
| 2008/0301362 A1 | 12/2008 | Cavanna et al. |
| 2008/0316845 A1 | 12/2008 | Wang et al. |
| 2009/0021999 A1 | 1/2009 | Tanimura et al. |
| 2009/0059641 A1 | 3/2009 | Jeddeloh |
| 2009/0077571 A1 | 3/2009 | Gara et al. |
| 2009/0161457 A1 | 6/2009 | Wakimoto |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0213675 A1 | 8/2009 | Shino |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0054011 A1 | 3/2010 | Kim |
| 2010/0074042 A1 | 3/2010 | Fukuda et al. |
| 2010/0080074 A1 | 4/2010 | Ohmaru et al. |
| 2010/0110809 A1 | 5/2010 | Kobayashi et al. |
| 2010/0110810 A1 | 5/2010 | Kobayashi |
| 2010/0131812 A1 | 5/2010 | Mohammad |
| 2010/0157693 A1 | 6/2010 | Iwai et al. |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0051530 A1 | 3/2011 | Kushida |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0216614 A1 | 9/2011 | Hosoe |
| 2011/0225355 A1 | 9/2011 | Kajigaya |
| 2011/0286271 A1 | 11/2011 | Chen |
| 2011/0310648 A1 | 12/2011 | Iwamoto et al. |
| 2011/0317462 A1 | 12/2011 | Gyllenhammer et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0213021 A1 | 8/2012 | Riho et al. |
| 2012/0254472 A1 | 10/2012 | Ware et al. |
| 2013/0003467 A1 | 1/2013 | Klein |
| 2013/0003477 A1 | 1/2013 | Park et al. |
| 2013/0057173 A1 | 3/2013 | Yao et al. |
| 2013/0107623 A1 | 5/2013 | Kavalipurapu et al. |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0078845 A1* | 3/2014 | Song ................ G11C 7/02 365/222 |
| 2014/0089576 A1 | 3/2014 | Bains et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0136763 A1 | 5/2014 | Li et al. |
| 2014/0143473 A1 | 5/2014 | Kim et al. |
| 2014/0177370 A1 | 6/2014 | Halbert et al. |
| 2014/0177376 A1* | 6/2014 | Song ............ G11C 11/4087 365/230.03 |
| 2014/0189215 A1 | 7/2014 | Kang et al. |
| 2014/0189228 A1 | 7/2014 | Greenfield et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0269021 A1 | 9/2014 | Yang et al. |
| 2014/0281206 A1 | 9/2014 | Crawford et al. |
| 2014/0281207 A1 | 9/2014 | Mandava et al. |
| 2014/0292375 A1 | 10/2014 | Angelini et al. |
| 2014/0293725 A1 | 10/2014 | Best et al. |
| 2014/0317344 A1 | 10/2014 | Kim |
| 2014/0355332 A1 | 12/2014 | Youn et al. |
| 2014/0369109 A1 | 12/2014 | Lee et al. |
| 2014/0379978 A1 | 12/2014 | Kim et al. |
| 2015/0049567 A1 | 2/2015 | Chi |
| 2015/0055420 A1 | 2/2015 | Bell et al. |
| 2015/0078112 A1 | 3/2015 | Huang |
| 2015/0089326 A1 | 3/2015 | Joo et al. |
| 2015/0155027 A1 | 6/2015 | Abe et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0213877 A1 | 7/2015 | Darel |
| 2015/0228341 A1 | 8/2015 | Watanabe et al. |
| 2015/0243339 A1 | 8/2015 | Bell et al. |
| 2015/0255140 A1 | 9/2015 | Song |
| 2015/0262652 A1 | 9/2015 | Igarashi |
| 2015/0279441 A1 | 10/2015 | Greenberg et al. |
| 2015/0279442 A1 | 10/2015 | Hwang |
| 2015/0294711 A1 | 10/2015 | Gaither |
| 2015/0340077 A1 | 11/2015 | Akamatsu |
| 2015/0356048 A1 | 12/2015 | King |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0919940 | 1/2016 | Jang et al. |
| 2016/0042782 A1 | 2/2016 | Narui et al. |
| 2016/0078911 A1 | 3/2016 | Fujiwara et al. |
| 2016/0078918 A1* | 3/2016 | Hyun ............ G11C 8/12 365/222 |
| 2016/0086649 A1 | 3/2016 | Hong et al. |
| 2016/0086651 A1* | 3/2016 | Kim ............ G11C 11/4076 365/222 |
| 2016/0093402 A1 | 3/2016 | Kitagawa et al. |
| 2016/0099043 A1 | 4/2016 | Tu |
| 2016/0111140 A1 | 4/2016 | Joo et al. |
| 2016/0125931 A1 | 5/2016 | Doo et al. |
| 2016/0133314 A1 | 5/2016 | Hwang et al. |
| 2016/0140243 A1 | 5/2016 | Adams et al. |
| 2016/0163372 A1 | 6/2016 | Lee et al. |
| 2016/0172056 A1 | 6/2016 | Huh |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0211008 A1 | 7/2016 | Benedict et al. |
| 2016/0225433 A1 | 8/2016 | Bains et al. |
| 2016/0225461 A1 | 8/2016 | Tuers et al. |
| 2016/0336060 A1 | 11/2016 | Shin |
| 2016/0343423 A1 | 11/2016 | Shido |
| 2017/0011792 A1 | 1/2017 | Oh et al. |
| 2017/0076779 A1 | 3/2017 | Bains et al. |

(56) References Cited

U.S. PATENT DOCUMENTS

| | | |
|---|---|---|
| 2017/0092350 A1 | 3/2017 | Halbert et al. |
| 2017/0117030 A1 | 4/2017 | Fisch et al. |
| 2017/0133085 A1 | 5/2017 | Kim et al. |
| 2017/0139641 A1 | 5/2017 | Cha et al. |
| 2017/0140807 A1 | 5/2017 | Sun et al. |
| 2017/0140811 A1 | 5/2017 | Joo |
| 2017/0148504 A1 | 5/2017 | Saifuddin et al. |
| 2017/0177246 A1 | 6/2017 | Miller et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0287547 A1 | 10/2017 | Ito et al. |
| 2017/0323675 A1 | 11/2017 | Jones et al. |
| 2017/0352399 A1 | 12/2017 | Yokoyama et al. |
| 2017/0371742 A1 | 12/2017 | Shim et al. |
| 2017/0372767 A1 | 12/2017 | Kang et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0060194 A1 | 3/2018 | Ryu et al. |
| 2018/0061483 A1 | 3/2018 | Morgan |
| 2018/0082737 A1 | 3/2018 | Lee |
| 2018/0084314 A1 | 3/2018 | Koyama |
| 2018/0090199 A1 | 3/2018 | Kim et al. |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0114561 A1 | 4/2018 | Fisch et al. |
| 2018/0114565 A1 | 4/2018 | Lee |
| 2018/0158504 A1 | 6/2018 | Akamatsu |
| 2018/0182445 A1 | 6/2018 | Lee et al. |
| 2018/0203621 A1 | 7/2018 | Ahn et al. |
| 2018/0218767 A1 | 8/2018 | Wolff |
| 2018/0261268 A1 | 9/2018 | Hyun et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2018/0366182 A1 | 12/2018 | Hyun et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0066759 A1 | 2/2019 | Nale |
| 2019/0066762 A1 | 2/2019 | Koya |
| 2019/0088315 A1 | 3/2019 | Saenz et al. |
| 2019/0088316 A1 | 3/2019 | Inuzuka et al. |
| 2019/0096492 A1 | 3/2019 | Cai et al. |
| 2019/0103147 A1 | 4/2019 | Jones et al. |
| 2019/0130961 A1 | 5/2019 | Bell et al. |
| 2019/0139599 A1 | 5/2019 | Ito et al. |
| 2019/0147941 A1 | 5/2019 | Qin et al. |
| 2019/0147964 A1 | 5/2019 | Yun et al. |
| 2019/0161341 A1 | 5/2019 | Howe |
| 2019/0172518 A1 | 6/2019 | Chen et al. |
| 2019/0196730 A1 | 6/2019 | Imran |
| 2019/0198078 A1 | 6/2019 | Hoang et al. |
| 2019/0198090 A1 | 6/2019 | Lee |
| 2019/0198099 A1 | 6/2019 | Mirichigni et al. |
| 2019/0205253 A1 | 7/2019 | Roberts |
| 2019/0207736 A1 | 7/2019 | Ben-tovim et al. |
| 2019/0228810 A1 | 7/2019 | Jones et al. |
| 2019/0228813 A1 | 7/2019 | Nale et al. |
| 2019/0228815 A1 | 7/2019 | Morohashi et al. |
| 2019/0237132 A1 | 8/2019 | Morohashi |
| 2019/0243708 A1 | 8/2019 | Cha et al. |
| 2019/0252020 A1 | 8/2019 | Rios et al. |
| 2019/0267077 A1 | 8/2019 | Ito et al. |
| 2019/0279706 A1 | 9/2019 | Kim |
| 2019/0333573 A1 | 10/2019 | Shin et al. |
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0348107 A1 | 11/2019 | Shin et al. |
| 2019/0349545 A1 | 11/2019 | Koh et al. |
| 2019/0362774 A1 | 11/2019 | Kuramori et al. |
| 2019/0371391 A1 | 12/2019 | Cha et al. |
| 2019/0385661 A1 | 12/2019 | Koo et al. |
| 2019/0385667 A1 | 12/2019 | Morohashi et al. |
| 2020/0005857 A1 | 1/2020 | Ito et al. |
| 2020/0075106 A1 | 3/2020 | Tokutomi et al. |
| 2020/0082873 A1 | 3/2020 | Wolff |
| 2020/0090760 A1 | 3/2020 | Purahmad et al. |
| 2020/0135263 A1 | 4/2020 | Brown et al. |
| 2020/0194050 A1 | 6/2020 | Akamatsu |
| 2020/0194056 A1 | 6/2020 | Sakurai et al. |
| 2020/0201380 A1 | 6/2020 | Murali et al. |
| 2020/0202921 A1 | 6/2020 | Morohashi et al. |
| 2020/0211626 A1 | 7/2020 | Hiscock et al. |
| 2020/0211633 A1 | 7/2020 | Okuma |
| 2020/0211636 A1 | 7/2020 | Hiscock et al. |
| 2020/0251158 A1 | 8/2020 | Shore et al. |
| 2020/0294576 A1 | 9/2020 | Brown et al. |
| 2020/0302994 A1 | 9/2020 | Enomoto et al. |
| 2020/0321049 A1 | 10/2020 | Meier et al. |
| 2020/0349995 A1 | 11/2020 | Shore et al. |
| 2020/0365208 A1 | 11/2020 | Schreck et al. |
| 2020/0381040 A1 | 12/2020 | Penney et al. |
| 2020/0395072 A1 | 12/2020 | Penney et al. |
| 2021/0005229 A1 | 1/2021 | Hiscock et al. |
| 2021/0005240 A1 | 1/2021 | Brown et al. |
| 2021/0020223 A1 | 1/2021 | Ayyapureddi et al. |
| 2021/0020262 A1 | 1/2021 | Penney et al. |
| 2021/0026732 A1 | 1/2021 | Park et al. |
| 2021/0057012 A1 | 2/2021 | Ayyapureddi et al. |
| 2021/0057013 A1 | 2/2021 | Jenkinson et al. |
| 2021/0057021 A1 | 2/2021 | Wu et al. |
| 2021/0065755 A1 | 3/2021 | Kim et al. |
| 2021/0065764 A1 | 3/2021 | Cheng et al. |
| 2021/0142852 A1 | 5/2021 | Schreck et al. |
| 2021/0158851 A1 | 5/2021 | Ayyapureddi et al. |
| 2021/0158860 A1 | 5/2021 | Wu et al. |
| 2021/0158861 A1 | 5/2021 | Jeong et al. |
| 2021/0201984 A1 | 7/2021 | Khasawneh et al. |
| 2021/0225432 A1 | 7/2021 | Enomoto et al. |
| 2021/0241810 A1 | 8/2021 | Hollis et al. |
| 2021/0265504 A1 | 8/2021 | Ishizu et al. |
| 2021/0343324 A1 | 11/2021 | Brown et al. |
| 2021/0350844 A1 | 11/2021 | Morohashi et al. |
| 2021/0398592 A1 | 12/2021 | Penney et al. |
| 2021/0407583 A1 | 12/2021 | Penney et al. |

FOREIGN PATENT DOCUMENTS

| | | |
|---|---|---|
| CN | 101067972 A | 11/2007 |
| CN | 101331554 A | 12/2008 |
| CN | 101458658 A | 6/2009 |
| CN | 101622607 A | 1/2010 |
| CN | 102113058 A | 6/2011 |
| CN | 102483952 A | 5/2012 |
| CN | 104350546 A | 2/2015 |
| CN | 106710621 A | 5/2017 |
| CN | 107871516 A | 4/2018 |
| JP | H0773682 A | 3/1995 |
| JP | 2005-216429 A | 8/2005 |
| JP | 2011-258259 | 12/2011 |
| JP | 4911510 B2 | 1/2012 |
| JP | 2013-004158 A | 1/2013 |
| KR | 20150002783 A | 1/2015 |
| KR | 20170058022 A | 5/2017 |
| KR | 1020180064940 A | 6/2018 |
| KR | 1020180085184 A | 7/2018 |
| KR | 20190048049 A | 5/2019 |
| WO | 2019222960 A1 | 11/2019 |
| WO | 2020010010 A1 | 1/2020 |
| WO | 2021003085 A1 | 1/2021 |

OTHER PUBLICATIONS

U.S. Appl. No. 17/444,925 titled "Apparatuses and Methods for Countering Memory Attacks" filed Aug. 12, 2021.
U.S. Appl. No. 16/818,981 titled "Apparatuses and Methods for Staggered Timing of Targeted Refresh Operations" filed Mar. 13, 2020, pp. all.

(56) References Cited

OTHER PUBLICATIONS

U.S. Appl. No. 16/824,460, titled "Semiconductor Device Performing Row Hammer Refresh Operation", dated Mar. 19, 2020, pp. all.
U.S. Appl. No. 16/783,063, titled "Apparatus and Methods for Triggering Row Hammer Address Sampling", dated Feb. 5, 2020, pp. all.
U.S. Appl. No. 16/232,837, titled "Apparatuses and Methods for Distributed Targeted Refresh Operations", filed Dec. 26, 2018, pp. all.
U.S. Appl. No. 16/818,989, titled "Semiconductor Device Performing Row Hammer Refresh Operation", dated Mar. 13, 2020, pp. all.
U.S. Appl. No. 16/286,187 titled "Apparatuses and Methods for Memory Mat Refresh Sequencing" filed Feb. 26, 2019, pp. all.
U.S. Appl. No. 16/084,119, titled "Apparatuses and Methods for Pure-Time, Self Adopt Sampling for Row Hammer Refresh Sampling", filed Sep. 11, 2018, pp. all.
U.S. Appl. No. 16/375,716 titled "Apparatuses and Methods for Staggered Timing of Targeted Refresh Operations" filed Apr. 4, 2019; pp. all.
U.S. Appl. No. 17/060,403 titled "Apparatuses and Methods for Adjusting Victim Data" filed Oct. 1, 2020, pp. all.
U.S. Appl. No. 16/549,411 titled "Apparatuses and Methods for Dynamic Refresh Allocation" filed Aug. 23, 2019, pp. all.
U.S. Appl. No. 16/655,110 titled "Apparatuses and Methods for Dynamic Targeted Refresh Steals" filed Oct. 16, 2019, pp. all.
International Application No. PCT/US19/64028, titled "Semiconductor Device Performing Row Hammer Refresh Operation", dated Dec. 2, 2019, pp. all.
International Application No. PCT/US20/26689, titled "Apparatuses and Methods for Staggered Timing of Targeted Refresh Operations", dated Apr. 3, 2020, pp. all.
U.S. Appl. No. 16/788,657, titled "Semiconductor Device Performing Row Hammer Refresh Operation", dated Feb. 12, 2020, pp. all.
U.S. Appl. No. 15/881,256 entitled 'Apparatuses and Methods for Detecting a Row Hammer Attack with a Bandpass Filter' filed Jan. 26, 2018, pp. all.
U.S. Appl. No. 16/537,981 titled "Apparatuses and Methods for Controlling Targeted Refresh Rates" filed Aug. 12, 2019, pp. all.
U.S. Appl. No. 17/153,555 titled "Apparatuses and Methods for Dynamically Allocated Aggressor Detection" filed Jan. 20, 2021, pp. all.
U.S. Appl. No. 17/201,941 titled "Apparatuses and Methods for Sketch Circuits for Refresh Binning" filed Mar. 15, 2021, pp. all.
U.S. Appl. No. 17/301,533 titled "Semiconductor Device Having CAM That Stores Address Signals" filed Apr. 6, 2021, pp. all.
U.S. Appl. No. 15/789,897, entitled "Apparatus and Methods for Refreshing Memory", filed Oct. 20, 2017; pp. all.
U.S. Appl. No. 16/208,217, titled "Semiconductor Device Performing Row Hammer Refresh Operation", filed Dec. 3, 2018, pp. all.
U.S. Appl. No. 16/230,300, titled "Apparatuses and Methods for Staggered Timing of Targeted Refresh Operations" filed Dec. 21, 2018, pp. all.
U.S. Appl. No. 16/290,730, titled "Semiconductor Device Performing Row Hammer Refresh Operation", filed Mar. 1, 2019, pp. all.
U.S. Appl. No. 16/374,623, titled "Semiconductor Device Performing Row Hammer Refresh Operation", filed Apr. 3, 2019, pp. all.
U.S. Appl. No. 16/431,641 titled "Apparatuses and Methods for Controlling Steal Rates" filed Jun. 4, 2019, pp. all.
PCT Application No. PCT/US18/55821 "Apparatus and Methods for Refreshing Memory" filed Oct. 15, 2018., pp. all.
U.S. Appl. No. 16/459,507 titled "Apparatuses and Methods for Adjusting Victim Data", filed Jul. 1, 2019, pp. all.
U.S. Appl. No. 17/154,945 titled "Apparatuses, Systems, and Methods for a Content Addressable Memory Cell" filed Jan. 21, 2021, pp. all.
U.S. Appl. No. 17/168,036 titled "Apparatuses and Methods for Analog Row Access Tracking" filed Feb. 4, 2021, pp. all.
U.S. Appl. No. 17/170,616 titled "Apparatuses, Systems, and Methods for Analog Row Access Rate Determination" filed Feb. 8, 2021, pp. all.
U.S. Appl. No. 17/446,710 titled "Apparatuses, Systems, and Methods for Determining Extremum Numerical Values" filed Sep. 1, 2021.
U.S. Appl. No. 17/470,883 titled "Apparatuses and Methods for Tracking Victim Rows" filed Sep. 9, 2021.
U.S. Appl. No. 17/007,069 titled "Apparatuses and Methods for Providing Refresh Addresses" filed Aug. 31, 2020, pp. all.
U.S. Appl. No. 17/375,817 titled "Apparatuses and Methods for Monitoring Word Line Accesses" filed Jul. 14, 2021, pp. all.
U.S. Appl. No. 17/443,056 titled "Apparatuses and Methods for Multiple Row Hammer Refresh Address Sequences" filed Jul. 20, 2021, pp. all.
International Application No. PCT/US20/40077, titled "Apparatuses and Methods for Monitoring Word Line Accesses", dated Jun. 29, 2020.
U.S. Appl. No. 16/546,152 titled "Apparatuses and Methods for Analog Row Access Tracking" filed Aug. 20, 2019.
U.S. Appl. No. 16/548,027 titled "Apparatuses, Systems, and Methods for Analog Row Access Rate Determination" filed Aug. 22, 2019.
U.S. Appl. No. 16/549,942 titled "Apparatuses and Methods for Lossy Row Access Counting" filed Aug. 23, 2019.
U.S. Appl. No. 16/425,525 titled "Apparatuses and Methods for Tracking All Row Accesses" filed May 29, 2019.
U.S. Appl. No. 16/427,105 titled "Apparatuses and Methods for Priority Targeted Refresh Operations" filed May 30, 2019.
U.S. Appl. No. 16/427,140 titled "Apparatuses and Methods for Tracking Row Access Counts Between Multiple Register Stacks" filed May 30, 2019.
U.S. Appl. No. 16/437,811 titled "Apparatuses, Systems, and Methods for Determining Extremum Numerical Values" filed Jun. 11, 2019.
U.S. Appl. No. 16/513,400 titled "Apparatuses and Methods for Tracking Row Accesses" filed Jul. 16, 2019.
U.S. Appl. No. 16/237,291, titled "Apparatus and Methods for Refreshing Memory", filed Dec. 31, 2018.
U.S. Appl. No. 16/427,330 titled "Apparatuses and Methods for Storing Victim Row Data" filed May 30, 2019.
U.S. Appl. No. 16/428,625 titled "Apparatuses and Methods for Tracking Victim Rows" filed May 31, 2019.
Unpublished Application for Application No. PCT/US20/32684, titled "Apparatuses, Systems, and Methods for a Content Addressable Memory Cell", dated May 13, 2020.
U.S. Appl. No. 16/459,520 titled "Apparatuses and Methods for Monitoring Word Line Accesses", filed Jul. 1, 2019, pp. all.
Kim, et al., "Flipping Bits in MemoryWithout Accessing Them: An Experimental Study of DRAM Disturbance Errors", IEEE, Jun. 2014, 12 pgs.
Stout, et al., "Voltage Source Based Voltage-to-Time Converter", IEEE, downloaded Jul. 2020, Pg. All.
U.S. Appl. No. 17/456,849 titled "Apparatuses, Systems, and Methods for Main Sketch and Slim Sketch Circuitfor Row Address Tracking" filed Nov. 29, 2021.
U.S. Appl. No. 17/565,119 titled "Apparatuses and Methods for Row Hammer Counter Mat" filed Dec. 29, 2021.
U.S. Appl. No. 17/565,187 titled "Apparatuses and Methods for Row Hammer Counter Mat" filed Dec. 29, 2021.
International Search Report and Written Opinion for PCT Application No. PCT/US2021/058824, dated Mar. 3, 2022; pp. all.

\* cited by examiner

|  | Counter0 | Counter1 | Counter2 |
|---|---|---|---|
| Initial Increment | X | X | X |
| First Period | X+1 | X | X |
| Second Period | X+1 | X+2 | X |
| Third Period | X+1 | X+2 | X+3 |
| Fourth Period | X+4 | X+2 | X+3 |
| Fifth Period | X+4 | X+5 | X+3 |
| Sixth Period | X+4 | X+5 | X+6 |

FIG. 5

APPARATUSES AND METHODS FOR TRACKING WORD LINE ACCESSES

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto refresh operation may be carried out where a sequence of memory cells are periodically refreshed. Repeated access to a particular memory cell or group of memory cells (often referred to as a 'row hammer' attack) may cause an increased rate of data degradation in nearby memory cells. Similarly, an extended activation of a row may cause an increased rate of data degradation in nearby memory cells (often referred to as a 'clobber' attack). It may be desirable to identify and refresh memory cells affected by the attack in a targeted refresh operation in addition to the auto refresh operation. Identifying memory cells affected by the row hammer may require additional circuitry and/or increase timing requirements.

BRIEF DESCRIPTION OF THE DRAWINGS

FIG. 5 illustrates an example implementation of multiple counters for a word line according to an embodiment of the present disclosure.

DETAILED DESCRIPTION

Figure 1:
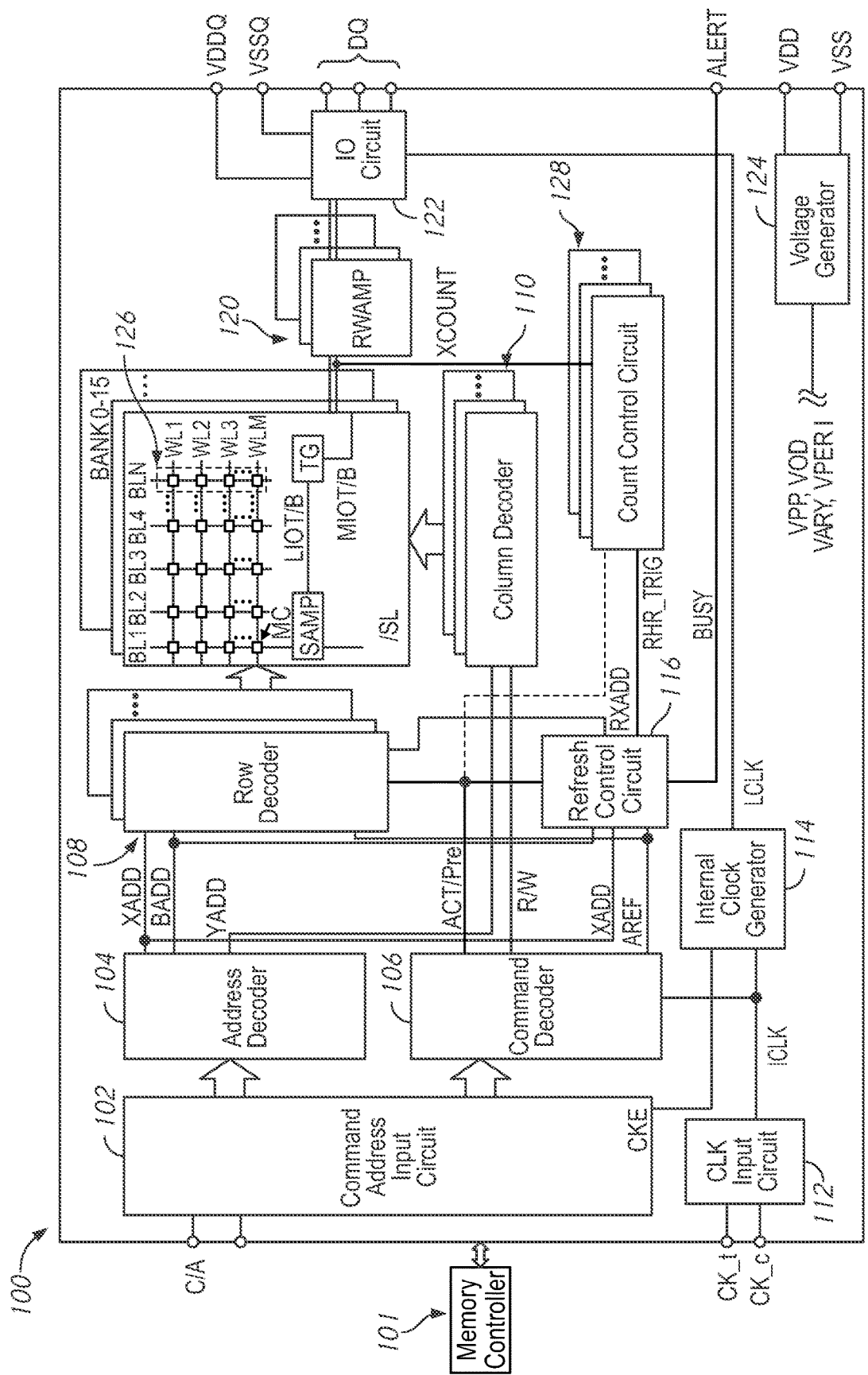
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (word lines) and columns (bit lines) of a memory array, and the memory cells may be refreshed on a row-by-row basis. In order to prevent information from being lost or corrupted due to this decay, the memory device may carry out refresh operations. During a refresh operation, information may be rewritten to the word line to restore its initial state. Auto refresh operations may be performed on the word lines of the memory in a sequence such that over time each of the word lines of the memory are refreshed at a rate faster than the expected rate of data degradation.

Various patterns of access to the memory (generally referred to as attacks) may cause an increased rate of data degradation in one or more memory cells, such that they would decay before they can be refreshed as part of the auto-refresh operation. For example, repeated access to a particular row of memory or extended activations (e.g., holding a row at an active voltage level) of a particular row (e.g., an aggressor row) may cause an increased rate of decay in rows (e.g., victim rows) which are close to the aggressor row. These repeated accesses and extended activation periods may be part of a deliberate attack against the memory and/or may be due to 'natural' access patterns of the memory. The increased rate of decay in the victim rows may require that they be refreshed as part of a targeted refresh operation. The memory device may periodically perform targeted refresh operations. The targeted refresh operations may be in addition to the auto refresh operations. For example, the memory device may perform a set of refresh operations including a number of auto refresh operations, and a number of targeted refresh operations and then repeat this cycle. In some memories, the targeted refresh operations may 'steal' timeslots which would otherwise be used for auto refresh operations. A memory device may generally cycle between performing access operations for a period of time, performing refresh operations for a period of time, performing access operations and so forth.

Memory devices may include circuitry for detecting aggressor rows and determining the corresponding victim rows to be refreshed during targeted refresh operations. Detecting aggressor rows may include tracking access of rows, for example, during read or write operations. When the access of a row meets one or more criteria, the row may be determined to be an aggressor row. For example, when a number of accesses of a row reaches a threshold within a certain period of time, the memory device may determine the row is an aggressor row. Victim rows of the aggressor row may then be determined and refreshed during targeted refresh operations.

Typically, one or more sampling techniques are used to track row accesses (e.g., non-random, semi-random, pseudo-random, and/or random sampling). That is, only some of the accesses of word lines are tracked. Thus, some aggressor rows may be missed, particularly if an attacker discovers a technique for avoiding the sampling periods. Furthermore, techniques that track numbers of accesses may miss aggressor rows where a word line is activated (e.g., "held open") for an extended period of time rather than repeatedly accessed. Accordingly, deterministic techniques for detecting aggressor rows of both row hammer and clobber attacks may be desirable.

According to embodiments of the present disclosure, individual word lines of a memory may include one or more memory cells designated to track accesses of the word line (e.g., count value memory cells). The count value memory cells may be read by a count control circuit each time the word line is accessed. The count value memory cells may store a value that represents a number of times the word line has been accessed (e.g., access count value, or simply count value). If the value is below a threshold value, the value may be changed by the count control circuit and written back to the count value memory cells. In some embodiments, the count control circuit may include a timer that may track how long the word line is activated. If the word line is activated over a certain interval of time, the count control circuit may change the value to be written back to the count value memory cells. Thus, the access count value may also represent a length of time the word line has been accessed. In some embodiments, the value may be changed for every interval of time the word line is activated. In some embodiments, the value may be written back to the count value memory cells after the value has been changed by the count control circuit. In some embodiments, the value may not be written back until a precharge command is received.

If the value is equal to or above the threshold value, the count control circuit may determine the word line is an aggressor row. In some embodiments, when an aggressor row is determined, victim rows corresponding to the aggressor row may be refreshed during a next scheduled targeted refresh operation. In some embodiments, the memory device may halt access operations and perform targeted refresh operations on the victim rows. In some embodiments, the memory device may provide an alert signal to a memory controller to indicate that the memory device is performing targeted refresh operations.

In some embodiments, count value memory cells may implement multiple counters per word line, each storing a value. One or more of the values may be used to infer the access count value for the word line. In some applications, the multiple counters may reduce or eliminate the risk of the access count value being lost due to corruption during writing the value back to the count value memory cells.

Optionally, in some embodiments, additional memory cells may be included with the count value memory cells for storing error correction code (ECC) data for the values stored in the count value memory cells. In embodiments when multiple counters are included, separate count value memory cells may be provided for storing ECC data for each counter.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including multiple memory banks. In the embodiment of FIG. 1, the memory array 118 is shown as including sixteen memory banks BANK0-BANK15. More or fewer banks may be included in the memory array 118 of other embodiments. Each memory bank includes a plurality of word lines WL, a plurality of bit lines BL and BL, and a plurality of memory cells MC arranged at intersections of the plurality of word lines W L and the plurality of bit lines BL and /BL. In some embodiments, one or more of the memory cells MC of each word line may be count value memory cells 126. In some embodiments, the count value memory cells 126 may be positioned at the intersection of count bit lines and the word lines. There may be multiple count value memory cells 126 along a given word line and values stored in the count value memory cells 126 may represent a respective access count XCount of the word line and/or data related to the access count XCount. The access count may be a measure of how many times a word line is accessed and/or how long the word line is activated during an access operation. In some embodiments, the count value memory cells 126 may be organized into subsets, each of the subsets including one or more count value memory cells 126 such that values stored in the count value memory cells 126 of each subset represent a separate access count or data related to a separate access count. Each subset of count value memory cells 126 may be referred to as a counter. For example, a word line including three subsets of count value memory cells 126 includes three counters, each counter storing a value representing an access count or a value related to an access count. A data bus associated with the count value memory cells 126 may be coupled to a count control circuit 128. The data bus associated with the count value memory cells 126 may be separate from the data bus which couples the other memory cells to the IO circuit 122.

Optionally, the count value memory cells 126 may further store error correction code (ECC) information. In some embodiments, one or more count value memory cells for storing ECC information may be provided for each counter when multiple counters are included for a word line. The ECC information for the count value memory cells 126 may be used to detect bit errors in the count value memory cells 126, which may alter the value stored in the count value memory cells 126.

The selection of the word line WL is performed by a row decoder circuit 108 and the selection of the bit lines BL and /BL is performed by a column decoder circuit 110. In the embodiment of FIG. 1, the row decoder circuit 108 includes a respective row decoder circuit for each memory bank and the column decoder circuit 110 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL. Information may be generally be read from and written to the count value memory cells 126 in an analogous fashion, except that the data in the count value memory cells 126 are read and written by the count control circuit 128.

The semiconductor device 100 may employ a plurality of external terminals that include command and address (C/A) terminals coupled to a command and address bus to receive commands and addresses, and a CS signal, clock terminals to receive clocks CK_t and CK_c, data terminals DQ to provide data, and power supply terminals to receive power supply potentials VDD, VSS, VDDQ, and VSSQ.

The clock terminals are supplied with external clocks CK_t and CK_c that are provided to an input circuit 112. The external clocks may be complementary. The input circuit 112 generates an internal clock ICLK based on the CK_t and CK_c clocks. The ICLK clock is provided to the command decoder circuit 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 202, to an address decoder 104. The address decoder 104 receives the address and supplies a decoded row address XADD to the row decoder circuit 108 and supplies a decoded column address YADD to the column decoder circuit 110. The address decoder 104 may also supply a decoded bank address BADD, which may indicate the bank of the memory array 118 containing the decoded row address XADD and column address YADD. The C/A terminals may be supplied with commands. Examples of commands include access commands for accessing the memory, such as commands for performing read operations and commands for performing write operations. The access commands may be associated with one or more of a row address XADD, column address YADD, and/or bank address BADD to indicate the memory cell(s) to be accessed. In some embodiments, the commands and/or addresses may be provided by a component external to the device 100, for example, as shown in FIG. 1, a memory controller 101 in communication with the device 100.

The commands may be provided as internal command signals to a command decoder circuit 106 via the command/address input circuit 102. The command decoder circuit 106 includes circuits to decode the internal command signals to generate various internal signals and commands for performing operations. For example, the command decoder circuit 106 may provide a row command signal to select a word line and a column command signal to select a bit line.

The device 100 may receive access commands for performing read operations. When the commands are received, and a bank address, a row address and a column address are timely supplied with the commands, read data is read from memory cells MC in the memory array 118 corresponding to the row address and column address. The commands are received by the command decoder circuit 106, which provides internal commands so that read data from the memory array 118 is provided to the read/write amplifiers 120. The read data is output to outside from the data terminals DQ via the input/output circuit 122. The access count XCount stored in the count value memory cells 126 of the word line associated with the row address XADD are read to the count control circuit 128. The count control circuit 128 may update the access count XCount and provide the updated access count to the memory array 118 to write back to the count value memory cells 126 of the word line associated with the row address XADD. In embodiments with multiple counters, access count XCount may include multiple values (e.g., XCount0-XCountN).

The device 100 may receive access commands for performing write operations. When the commands are received, and a bank address, a row address and a column address are timely supplied with the commands, write data supplied to the data terminals DQ is written to a memory cells in the memory array 118 corresponding to the row address and column address. The commands are received by the command decoder circuit 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. The access count XCount stored in the count value memory cells 126 of the word line associated with the row address XADD are read to the count control circuit 128. The count control circuit 128 may update the access count XCount and provide the updated access count to the memory array 118 to write back to the count value memory cells 126 of the word line associated with the row address XADD.

After various access commands have been received, such as those described above, a precharge command may be received. In some embodiments, the precharge command may be indicated by an active precharge signal Pre. In some embodiments, a deactivation of the activation ACT signal may indicate the active precharge signal Pre. A word line may be deactivated (e.g., "closed") responsive to the Pre signal. In some cases, if an operation is being performed on the word line (e.g., writing data to the word line) when the active precharge signal Pre is received, the operation may not be completed. In some cases, an incomplete operation may lead to incorrect or corrupted data on the word line.

Returning to the count control circuit 128, when an access count XCount is provided for a word line, the count control circuit 128 may compare the access count XCount to a threshold value. If the access count XCount is below the threshold value, the count control circuit 128 may change (e.g., increment, decrement) the access count XCount for the word line and provide the updated access count to the memory array 118 as described previously. If the access count XCount is equal to or greater than the threshold value, the count control circuit 128 may activate an aggressor row detection signal RHR_TRIG, which may be provided to a refresh control circuit 116. In some embodiments, the count control circuit 128 may change the access count XCount after activating the RHR_TRIG signal (e.g., reset to an initial value, reset to zero).

In some embodiments, the count control circuit 128 may include a timer (not shown in FIG. 1). The timer may track how long the word line corresponding to the access count XCount is activated. The timer may track a number of time periods (e.g., a number of clock cycles, a number of nanoseconds, a number of microseconds) the word line is activated. For each time period that elapses, the count control circuit 128 may update the access count XCount. In some embodiments, the count control circuit 128 may compare the updated access count XCount to the threshold value each time the access count XCount is updated as discussed previously. Various techniques may be used to detect how long the word line is activated. For example, the count control circuit 128 may track how long the activation signal ACT is active. In another example, the count control circuit 128 may track how long the word line is held at an active voltage. Other techniques may be used in other embodiments.

In some embodiments, the count control circuit 128 may write the updated access count to the memory array 118 after the active precharge signal Pre has been received. This may reduce the risk of or prevent the value from being corrupted while the value is being written to the count value memory cells 126. In some embodiments, the count control circuit 128 may write the updated access count value to one of multiple counters included in a word line of the memory array 118 regardless of the state of the Pre. In these embodiments, prior to comparing and/or updating the count value, the values of the multiple counters may be used to infer a correct value of the counter, even if the activation of the precharge signal causes the value written to the counter to be corrupted.

The device 100 may also receive commands causing it to carry out one or more refresh operations as part of a self-refresh mode. The device 100 may be periodically placed in a refresh mode. Thus, refresh operations may be performed periodically each time the memory device is in the refresh mode. In some embodiments, the refresh mode command may be externally issued to the memory device 100. In some embodiments, the refresh mode command may be periodically generated by a component of the device. In some embodiments, when an external signal indicates a refresh mode entry command (e.g., an external refresh command), the refresh signal AREF may also be activated. The refresh signal AREF may be a pulse signal which is activated when the command decoder circuit 106 receives a signal which indicates entry to the self-refresh mode. The refresh signal AREF may be activated once immediately after command input, and thereafter may be cyclically activated at desired internal timing. In some embodiments, the refresh signal AREF may cause more than one refresh operation to be performed, which may be referred to as a "multi pump" refresh. In some embodiments, the refresh signal AREF may be active during the refresh mode. In some embodiments, the refresh signal AREF may be active during the multiple refresh operations. The refresh signal AREF may be used to control the timing of refresh operations during the refresh mode. A self-refresh exit command may cause the automatic activation of the refresh signal AREF to stop and may cause the device 100 to return to an idle state and/or resume other operations.

The refresh signal AREF is supplied to the refresh control circuit 116. The refresh control circuit 116 supplies a refresh row address RXADD to the row decoder circuit 108, which may refresh one or more word lines WL indicated by the refresh row address RXADD. In some embodiments, the refresh address RXADD may represent a single word line. In some embodiments, the refresh address RXADD may represent multiple word lines, which may be refreshed sequentially or simultaneously by the row decoder circuit 108. In some embodiments, the number of word lines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of word lines represented by the address), or may operate based on internal logic.

The refresh control circuit 116 may selectively output a targeted refresh address (e.g., which specifies one or more victim address based on an aggressor) or an automatic refresh address (e.g., from a sequence of auto refresh addresses) as the refresh address RXADD. Based on the type of refresh address RXADD, the row decoder circuit 108 may perform a targeted refresh or auto refresh operation. The automatic refresh addresses may be from a sequence of addresses which are provided based on activations of the refresh signal AREF and/or pumps generated responsive to AREF. The refresh control circuit 116 may cycle through the sequence of auto refresh addresses at a rate determined by AREF. In some embodiments, the auto refresh operations may generally occur with a timing such that the sequence of auto refresh addresses is cycled such that no information is expected to degrade in the time between auto refresh operations for a given word line. In other words, auto refresh operations may be performed such that each word line is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. For example, in some embodiments, the refresh control circuit 116 may latch a current row address XADD as an aggressor row address responsive to an active RHR_TRIG signal provided by the count control circuit 128. The refresh address RXADD may be calculated based on the latched row addresses XADD provided by the address decoder 104. The refresh address RXADD may be provided with a timing based on a timing of the refresh signal AREF.

While in general the present disclosure refers to determining aggressor and victim word lines and addresses, it should be understood that as used herein, an aggressor word line does not necessarily need to cause data degradation in neighboring word lines, and a victim word line does not necessarily need to be subject to such degradation. The device 100 may use some criteria to judge whether an address is an aggressor address, which may capture potential aggressor addresses rather than definitively determining which addresses are causing data degradation in nearby victims. Similarly, victim addresses may be determined based on which word lines are expected to be effected by aggressors, rather than a definitive determination of which word lines are undergoing an increased rate of data decay.

The refresh address RXADD may be provided with a timing based on a timing of the refresh signal AREF. During the periodic refresh operations of a refresh mode, the refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto refresh address. In some embodiments, certain time slots may be reserved for targeted refresh addresses, and the refresh control circuit 116 may determine whether to provide a targeted refresh address, not provide an address during that time slot, or provide an auto refresh address instead during the time slot.

The refresh control circuit 116 may use multiple methods to determine the timing of targeted refresh operations. The refresh control circuit 116 may have periodic targeted refresh operations during a refresh mode, where the refresh control circuit 116 performs auto refresh operations and targeted refresh operations (e.g., by providing a targeted refresh address as the refresh address RXADD) based on a periodic schedule. For example, after entering a refresh mode, the refresh control circuit 116 may perform a certain number of auto refresh operations, and then perform (e.g., steal) a certain number of targeted refresh operations. For multi pump refresh operations, each time the active refresh signal AREF is received, the refresh control circuit 116 may perform M different refresh operations, by providing M different refresh addresses RXADD. The refresh control circuit 116 may have a fixed pattern where some pumps are assigned to auto refresh operation and some pumps are assigned to targeted refresh operations.

In some embodiments, the refresh control circuit 116 may perform targeted refresh operations responsive to an active RHR_TRIG signal provided by the count control circuit 128. Targeted refresh operations performed responsive to the active RHR_TRIG may be in addition to or instead of period targeted refresh operations. In some embodiments, the targeted refresh operations responsive to the active RHR_TRIG signal may be performed outside of a regularly scheduled refresh mode. In some embodiments, the refresh control circuit may activate a busy signal BUSY, which may be provided to an external pin of device 100, such as an alert pin ALERT. The busy signal BUSY may be received by an external device, such as the memory controller 101, via the external pin. The busy signal BUSY may notify the external device that the device 100 is performing targeted refresh operations and is not available to perform access operations. Once the targeted refresh operations have been completed, the refresh control circuit 116 may deactivate the busy signal BUSY.

Although the count control circuit 128 is shown as a separate component in FIG. 1, in some embodiments, the count control circuit 128 may be included as a component of the refresh control circuit 116.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder circuit 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

As used herein, an activation of a signal may refer to any portion of a signal's waveform to which that a circuit responds. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

Figure 2:
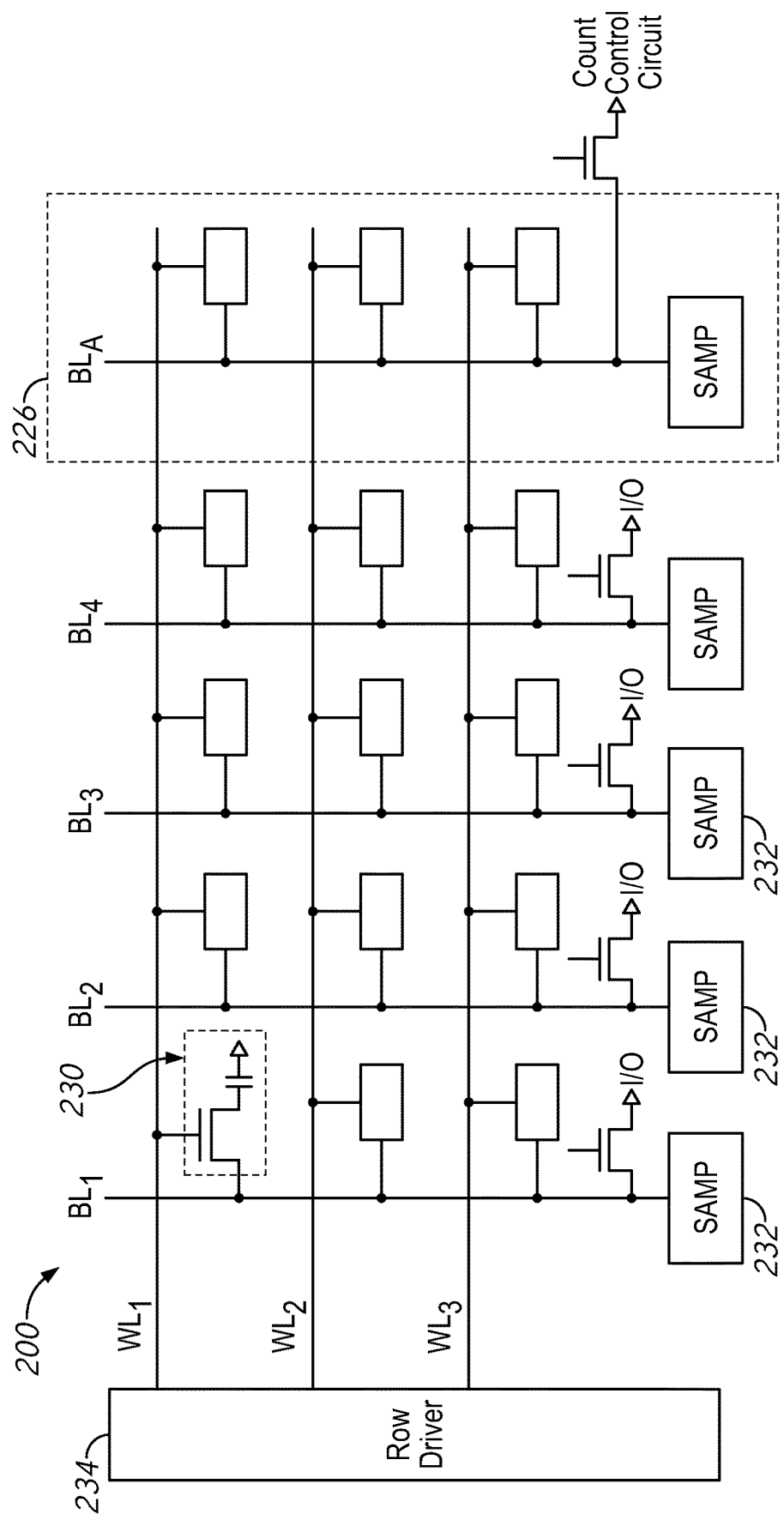
FIG. 2 is a block diagram of a memory cell array according to an embodiment of the present disclosure.

FIG. 2 is a block diagram of a memory cell array according to an embodiment of the present disclosure. The memory cell array 200 may represent an exemplary portion of a memory array, such as the memory array 118 of FIG. 1. The memory cell array 200 includes a plurality of word lines WL (rows) and bit lines BL (columns). A row driver 234 is coupled to the rows. In some embodiments, the row driver 234 may be controlled by a row decoder, such as row decoder circuit 108. A plurality of memory cells MC, such as example memory cell 230, are located at the intersection of the rows and columns. Certain of the memory cells along each of the word lines WL may be count value memory cells 126. Each of the bit lines BL may be coupled to a respective sense amplifier 232.

Each of the memory cells MC may store information. In some embodiments, the information may be stored as a binary code, and each memory cell MC may store a bit, which may be either at a logical high or a logical low level. Example memory cell 230 shows a particular implementation which may be used to store a bit of information in some embodiments. Other types of memory cells may be used in other examples. In the example memory cell 230, a capacitive element stores the bit of information as a charge. A first charge level may represent a logical high level, while a second charge level may represent a logical low level. One node of the capacitive element is coupled to a reference voltage (e.g., VSS). The other node of the capacitive element is coupled to a switch. In the example memory cell 230, the switch is implemented using a transistor. A sense node of the switch (e.g., the gate of the transistor) is coupled to the word line. The word line WL may be accessed by the row driver 234 setting a voltage along the word line such that the switches in the memory cells MC are closed, coupling the capacitive elements (or other bit storage element) to the associated bit lines BL.

The sense amplifiers 232 may read or write a value of a bit of information along the bit line BL to memory cell MC at the accessed word line WL. The sense amplifiers may convert a signal along the bit line to a signal which is 'readable' by other elements of the memory device (e.g., by amplifying a voltage). The bit lines may be coupled to an input/output circuit (e.g., input/output circuit 122 of FIG. 1) via a respective column select switch, which may be a column select transistor.

In an example read operation, when a word line WL is accessed, the memory cells MC may provide their charge onto the coupled bit lines BL which may cause a change in a voltage and/or current along the bit line BL. The sense amplifier 232 may determine a logical level of the accessed memory cell MC based on the resulting voltage and/or current along the bit line BL, and may provide a signal corresponding to the logical level through the column select transistor to the input/output circuit.

In an example write operation, the sense amplifiers 232 may receive a signal indicating a logical level to be written to the accessed memory cells from the input/output circuit. The sense amplifier 232 may provide a voltage and/or current along the coupled bit line BL (e.g., along the bit lines with active column select transistors) at a level corresponding to the logical level to be written. The voltage and/or current along the bit line BL may charge the capacitive element at the intersection of the bit line with an accessed word line to a charge level associated with the written logical level. In this manner, by specifying the row which is accessed, and which bit lines to record data from (and/or write data to), specific memory cells MC may be accessed during one or more operations of the memory device.

During an example refresh operation (either targeted or auto-refresh), the word line WL to be refreshed may be read, and then logical value read from each of the memory cells along that may be written back to the same memory cells. In this manner the level of charge in the refreshed memory cells MC may be restored to the full value associated with the logical level stored in that memory cell.

Certain memory cells along each of the word lines may be count value memory cells 226. The count value memory cells 226 may generally be similar to the other memory cells of the memory array 200. In some embodiments, the count value memory cells 226 may be physically the same as the other memory cells MC. However, rather than being coupled to the input/output circuit of the memory, the count value memory cells 226 may be coupled to a count control circuit (e.g., count control circuit 128 of FIG. 1). The count control circuit may read and/or write a value of an access count, which may be stored as a binary number in the count value memory cells 226 of a given word line. In some embodiments, the count control circuit may be in an area local to the count value memory cells 226, and so the communication of the count control circuit and the count value memory cells 226 may be very rapid.

In some embodiments, the count value memory cells 226 may be organized along particular bit lines of the memory array 200. Thus, there may be counter bit lines (and associated counter sense amplifiers 232) which are coupled to the count value memory cells 226. The count value memory cells 226 may be arranged at the intersection of the counter bit lines and the word lines. The counter bit lines may include counter select transistors (similar to the column select transistors), which selectively allow data from the counter bit lines to be read to the count control circuit. In some embodiments, the time duration over which the counter select transistors are active may be different (e.g., the counter select transistors may be active longer) than the time the column select transistor(s) are active in a given access operation. The counter bit lines and counter sense amplifiers may be coupled through a data bus to a count control circuit. In some embodiments, the count value memory cells 226 may be positioned along an end of the memory array 200. This may decrease a length of the counter data bus. For example, if there are some number n of count value memory cells 226 along each word line, the count value memory cells 226 may be the first n memory cells of the word line, or the last n memory cells of the word line.

For clarity of illustration, only a few word lines WL and bit lines BL (and their corresponding memory cells MC) are shown in FIG. 2. More word lines WL and bit lines BL may be provided in a memory array of the present disclosure. Similarly, FIG. 2 only shows a single counter bit line of count value memory cells 226. However, each word line WL may have a number of count value memory cells 226 based on an expected maximum value of an access count that may need to be stored in the count value memory cells 226. In some embodiments, there may be between 8 and 16 count value memory cells 226 along each word line. More or fewer count value memory cells 226 may be used in other examples. When multiple counters are implemented for each word line WL, each counter may include multiple count value memory cells 226. For example, when three counters are included for each word line WL and each counter includes eight count value memory cells 226, a total of 24 count value memory cells 226 may be included.

Optionally, additional count value memory cells 226 may be included when ECC information is stored for each counter. Thus, some of the count value memory cells 226 may store data corresponding to ECC information for count value memory cells 226 storing data related to a count value. The ECC information from the count value memory cells 226 may be provided to the count control circuit in a similar manner to the count value data stored on the count value memory cells 226.

Figure 3:
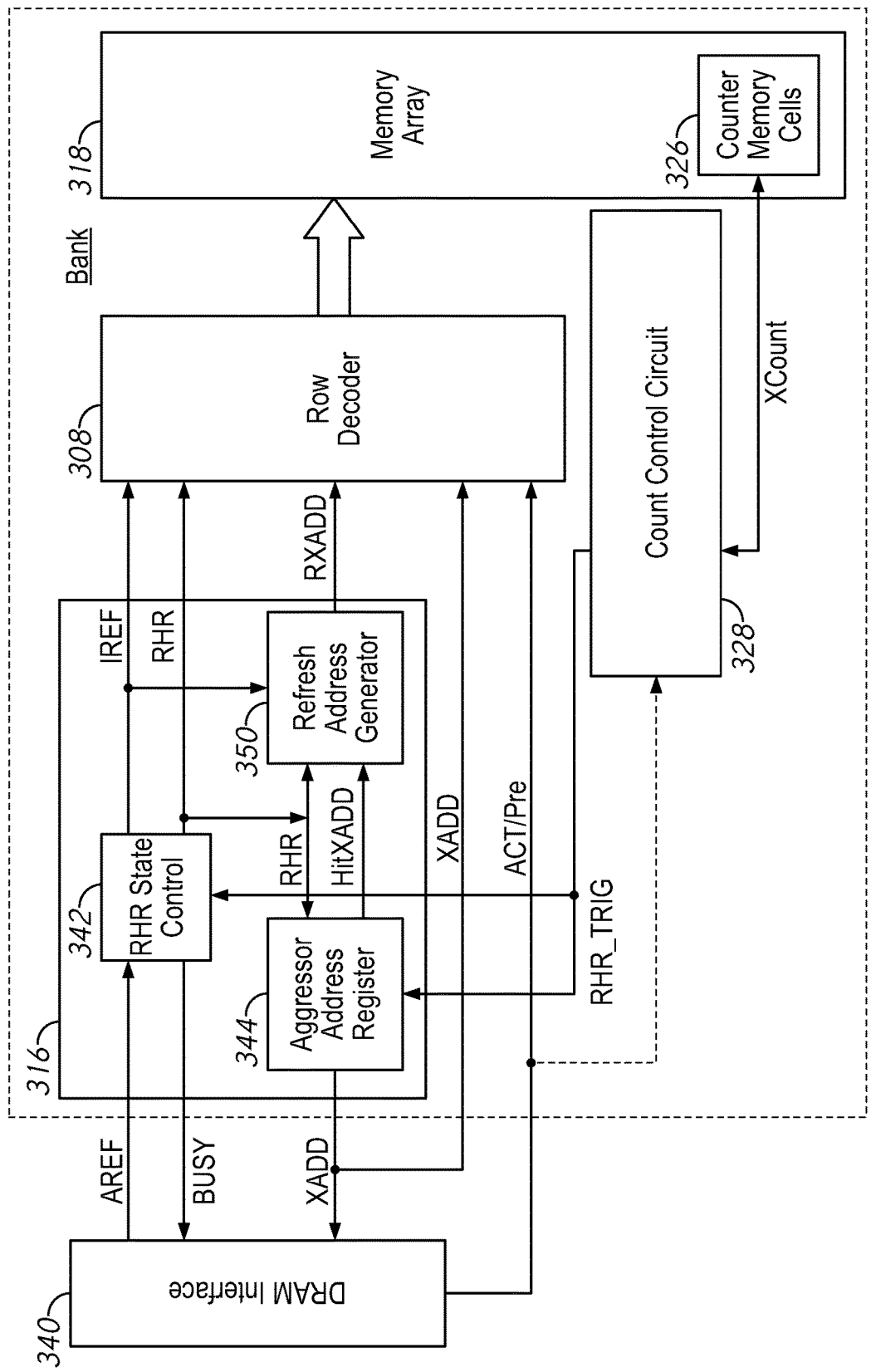
FIG. 3 is a block diagram of a refresh control circuit and a count control circuit according to an embodiment of the present disclosure.

FIG. 3 is a block diagram of a refresh control circuit and a count control circuit according to an embodiment of the present disclosure. For context, a row decoder 308, a DRAM interface 340, and a memory array 318 are also shown. In some embodiments, the refresh control circuit 316 may be used to implement the refresh control circuit 116 of FIG. 1. Similarly, the row decoder 308 may be used to implement the row decoder circuit 108, the memory array 318 may be used to implement memory array 118, and the count control circuit 328 may be used to implement the count control circuit 128 of FIG. 1. Certain internal components and signals of the refresh control circuit 316 are shown to illustrate the operation of the refresh control circuit 316. The dotted line around the refresh control circuit 316, the row decoder 308, and the memory array 318 is shown to represent that in certain embodiments, each of the components within the dotted line may correspond to a particular bank of memory (e.g., memory banks BANK0-15 of memory array 118), and that these components may be repeated for each of the banks of memory. In some embodiments, the components shown within the dotted line may be associated with each of the memory banks. Thus, there may be multiple refresh control circuits 316, count control circuits 328, and row decoders 308. For the sake of brevity, components for only a single bank will be described.

A DRAM interface 340 may provide one or more signals to the address refresh control circuit 316 and row decoder 308 which in turn (along with a column decoder, not shown) may perform access operations on the memory array 318. The DRAM interface 340 may represent one or more components which provides signals to components of the bank. In some embodiments, the DRAM interface 340 may include a memory controller coupled to the semiconductor memory device (e.g., memory controller 101). In some embodiments, the DRAM interface 340 may represent one or more components of a semiconductor device (e.g., device 100) such as the command address input circuit 102, the address decoder 104, and/or the command decoder circuit 106 of FIG. 1. The DRAM interface 340 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal which specifies one or more particular word lines of the memory array 318, and may be a signal including multiple bits (which may be transmitted in series or in parallel).

The count control circuit 328 may be coupled to the memory array 318, particularly, to the count value memory cells 326 of the memory array 318. The count value memory cells 326 may be used to implement the count value memory cells 126 and/or 226 in some embodiments. When a word line of the memory array 318 is accessed, the value XCount of the count value memory cells 326 along that word line are read to the count control circuit 328. In embodiments with multiple counters, the value XCount may include multiple values (XCount0-N). The count control circuit 328 may determine a value of the access count for that row based on the value(s) read from the count value memory cells 326. The count control circuit 328 may determine if the value of the access count for the word line exceeds a threshold value (e.g., if the value is greater than the threshold value) or is equal to a threshold value. If the value is not equal to or does not exceed the threshold (e.g., if the value is less than the threshold), then the count control circuit 328 may update (e.g., change) a value of the access count and write the updated count back to the count value memory cells 326. Updating the count may include incrementing or decrementing the count in some embodiments. If the value does equal or exceed the threshold, then the current address XADD may be determined to be an aggressor address. If the current address XADD is an aggressor address, an active aggressor row detection signal RHR_TRIG may be provided to the refresh control circuit 316, which may record (e.g., latch) the current value of the row address XADD. In some embodiments, the active aggressor row detection signal RHR_TRIG may further trigger a targeted refresh operation. In some embodiments, if the value of the count exceeds the threshold, then the count control circuit 328 may reset a value of the count, for example, by writing an initial value of the count (e.g., 0) back to the count value memory cells 326.

In some embodiments, the count control circuit 328 may further update the value of the count responsive to the passage of a period of time over which the word line is activated. For example, the count control circuit 328 may update the count value every time some number of nanoseconds has passed. The updated value of the count may be compared to the threshold value as described above after each update of the count value (e.g., after each period of time the word line remains activated). Various techniques may be used to determine how long a word line is activated. For example, in some embodiments, the count control circuit 328 may receive the ACT/Pre signal from the DRAM interface 340. The length of time the word line is activated may be based, at least in part, on a length of time the ACT signal is active. In another example, a charge on the word line may be detected. The length of time the word line is activated may be based, at least in part, on a length of time the charge (e.g., voltage) of the word line is equal to or above an activation level.

In some embodiments, the refresh control circuit 316 may include an RHR state control circuit 342, an aggressor address register 344, and a refresh address generator 350.

The RHR state control circuit 342 may receive the AREF signal from the DRAM interface and the RHR_TRIG signal from the count control circuit 328. The RHR state control circuit 342 may provide an active signal RHR to indicate that a targeted refresh operation, such as a row hammer refresh (e.g., a refresh of the victim rows corresponding to an identified aggressor row) should occur. In some embodiments, the RHR state control circuit 342 may further provide a BUSY signal to the DRAM interface 340 to indicate performance of the targeted refresh operation. The RHR state control circuit 342 may also provide an active internal refresh signal IREF, to indicate that an auto-refresh operation should occur. The auto-refresh signal AREF may be periodically activated and may be used to control the timing of refresh operations. In some embodiments, the signals RHR and IREF may be activated such that they are not active at the same time (e.g., are not both at a high logic level at the same time).

The memory device may carry out a sequence of auto-refresh operations in order to periodically refresh the rows of the memory device. The RHR signal may be activated in order to indicate that the device should refresh a particular targeted row (e.g., a victim row) instead of an address from the sequence of auto-refresh addresses. The RHR state control circuit 342 may use internal logic to provide the active RHR signal. For example, in some embodiments, the RHR state control circuit 342 may provide the active RHR signal based on certain number of activations of AREF (e.g., every 4th activation of AREF). Additionally or alternatively, the RHR state control circuit 342 may activate the RHR signal responsive to receiving an active RHR_TRIG signal from the count control circuit 328. In some embodiments, the active RHR_TRIG may trigger the refresh control circuit 316 to cause a targeted refresh operation to be performed outside the time period of a regularly scheduled refresh operation.

In some embodiments, the RHR state control circuit 342 may activate the BUSY signal during targeted refresh operations. In some embodiments, the BUSY signal may be activated when the RHR signal is activated. In some embodiments, the BUSY signal may be activated only when the RHR signal is activated outside a regularly scheduled refresh period. The active BUSY signal may notify other components of the semiconductor device including the refresh control circuit 316 or a component in communication with the device (e.g., a memory controller) that the memory array 318 is unavailable for access operations. In some embodiments, the BUSY signal may be provided to an externally available pin of a semiconductor device including the refresh control circuit 316 (e.g., an alert pin). When the targeted refresh operation is completed, the RHR state control circuit 342 may deactivate the BUSY signal.

Responsive to an activation of RHR, the aggressor address register 344 may provide an aggressor address HitXADD, and the refresh address generator 350 may provide a refresh address RXADD, which may be one or more victim addresses associated with HitXADD (e.g., row addresses of victim rows of the identified aggressor row). Responsive to IREF, the refresh address generator 350 may provide an auto-refresh address as the refresh address RXADD. The row decoder 308 may perform a refresh operation responsive to the refresh address RXADD and the targeted refresh signal RHR. The row decoder 308 may perform an auto-refresh operation based on the refresh address RXADD and the internal refresh signal IREF.

The aggressor address register 344 may store one or more row addresses which have been identified as aggressor addresses by the count control circuit 328. Responsive to the command signal RHR_TRIG from the count control circuit 328, the aggressor address register 344 may store the current row address XADD which is being accessed. The aggressor address register 344 may provide the stored address as a match address HitXADD to the refresh address generator 350, which may calculate one or more victim addresses associated with the match address HitXADD. In some embodiments, the aggressor address register 344 may be a latch circuit which stores a single address. In some embodiments, the aggressor address register 344 may be a buffer which stores multiple addresses, and provides the first stored address as the match address HitXADD. The aggressor address register 344 may switch to a next address in the register after the victim row(s) associated with the first address have been refreshed.

The refresh address generator 350 may receive the targeted refresh signal RHR and the match address HitXADD. The match address HitXADD may represent an aggressor row. The refresh address generator 350 may determine the locations of one or more victim rows based on the match address HitXADD and provide them as the refresh address RXADD. In some embodiments, the victim rows may include rows which are physically adjacent to the aggressor row or rows (e.g., HitXADD+1 and HitXADD−1). Other relationships between victim rows and the identified aggressor rows may also or alternatively be used in other examples.

The refresh address generator 350 may determine the value of the refresh address RXADD based on the targeted refresh signal RHR and the internal auto-refresh signal IREF. In some embodiments, when the signal IREF is active, the refresh address generator 350 may provide one of a sequence of auto refresh addresses. When the signal RHR is active, the refresh address generator 350 may provide a targeted refresh address, such as a victim address, as the refresh address RXADD. In some embodiments, multiple targeted refresh addresses may be provided for a refresh operation. For example, for a multi pump refresh operation, a different targeted refresh address may be provided for each pump (e.g., HitXADD+1 and HitXADD−1).

The row decoder 308 may perform one or more operations on the memory array 318 based on the received signals and addresses. For example, responsive to the activation signal ACT and the row address XADD (and IREF and RHR being inactive), the row decoder 308 may direct one or more access operations (for example, a read operation) on the specified row address XADD. Responsive to the RHR signal being active, the row decoder 308 may refresh the refresh address RXADD. In some embodiments, the count control circuit 328 may increment the access count stored in the count value memory cells 326 responsive to a refresh operation of a given row. In some embodiments, the count control circuit 328 may not increment the access count responsive to a refresh operation.

Figure 4:
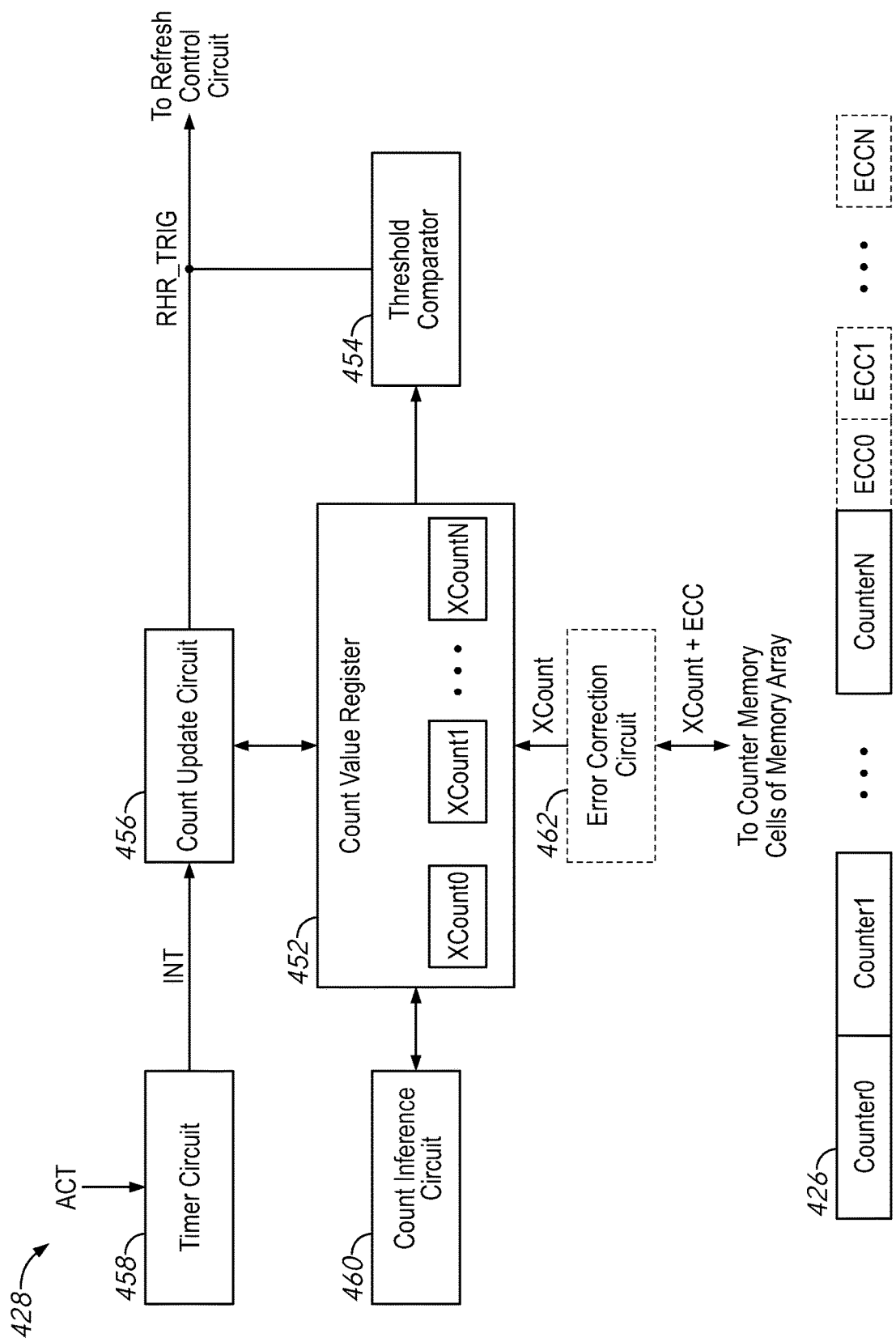
FIG. 4 is a block diagram of a count control circuit according to an embodiment of the present disclosure.

FIG. 4 is a block diagram of a count control circuit according to an embodiment of the present disclosure. In some embodiments, the count control circuit 428 may be used to implement the count control circuit 128 of FIG. 1 or the count control circuit 328 of FIG. 3. The count control circuit 428 may include a count value register 452, a threshold comparator 454, a count update circuit 456, a timer circuit 458, a count inference circuit 460, and optionally, an error correction circuit 462. The count control circuit 428 may be coupled to count value memory cells of a memory array (e.g., memory array 118). A block diagram of the count value memory cells 426 for a word line is shown for context. The count value memory cells 426 may include count value memory cells 326 of memory array 318, count value memory cells 226, and/or count value memory cells 126 in some embodiments.

As illustrated in the example in FIG. 4, the count value memory cells 426 may implement one or more counters Counter0-CounterN, each of which may store a value corresponding to and/or associated with a value representing a number of times and/or length of time the word line has been accessed, an access count value XCount. As described with reference to FIGS. 1-3, the data stored in the count value memory cells 426 of a word line may be provided to the count control circuit 428 during an access operation performed on the word line. In some embodiments, such as when the count value memory cells implement multiple counters, the count value XCount may include one or more count values XCount0-N.

The count value XCount may be received from the count value memory cells by the count value register 452. The count value register 452 may store one or more count values XCount0-N. In some embodiments the count value register 452 may include multiple registers, one for storing each of the count values. In some embodiments, the number of count values stored and/or the number of registers in count value register 452 may be based, at least in part, on a number of counters implemented by the count value memory cells of the word lines of the memory array. For example, if count value memory cells of a word line implement three counters, the count value register 452 may store three count values. In another example, if the count value memory cells of the word line implement a single counter, the count value register 452 may store one count value. For example, if there are N counters, each of which stores an M-bit count value, then there may be N*M count memory cells along the word line.

The count value XCount may be provided to a threshold comparator 454. The threshold comparator 454 may compare the count value to a threshold value. In some embodiments, the threshold value may be a set value. In some embodiments, the threshold comparator 454 may include a programmable register or other programmable medium that can store a desired threshold value. In some embodiments, the threshold value may be provided to the threshold comparator 454 upon manufacturing or initialization of a device including the count control circuit 428. In some embodiments, the threshold value may be provided to the threshold comparator 454 by a memory controller (e.g., memory controller 101) and/or another component of the device (e.g., command decoder, mode register). If a count value is equal to or greater than the threshold value, the threshold comparator 454 may activate an aggressor row detection signal RHR_TRIG signal. As discussed with reference to FIGS. 1 and 3, the RHR_TRIG signal may be provided to a refresh control circuit, such as refresh control circuit 116 and/or 316. The active RHR_TRIG signal may cause the refresh control circuit to latch a current row address and/or trigger a targeted refresh operation.

In some embodiments, the count value XCount may be provided to a count update circuit 456. The count update circuit 456 may update the value of the count and provide the updated count value back to the count value register 452. The count value register 452 may provide the updated count value received from the count update circuit 456 back to the count value memory cells of the word line of the memory array for storage. In some embodiments, updating the count value may include incrementing or decrementing the count value XCount. In some embodiments, the count update circuit 456 may update the count value XCount each time the count value is received responsive to an access operation on the word line. In some embodiments, the count update circuit 456 may update the count value responsive to an active interval signal INT is provided by a timer circuit 458.

The timer circuit 458 may measure a period of time the word line is activated. In some embodiments, such as the one shown in FIG. 4, the timer circuit 458 may measure a length of time the activation signal ACT is active. The timer circuit 458 may activate the interval signal INT each time the period of time has passed. For example, the timer circuit 458 may activate the interval signal INT for every 100 ns the activation signal ACT is active. The time period of 100 ns is provided only as an example, and any other time period may be used (e.g., 50 ns, 200 ns, 500 ns). In some embodiments, the interval signal INT may be a pulse signal. In some embodiments, the timer circuit 458 may include an oscillator and a multibit counter circuit, and a pulse generator (not shown). The multibit counter may count the number of oscillations and trigger the pulse generator each time the multibit counter reaches a maximum count value and resets to an initial value. However, the timer circuit 458 may include different and/or additional components in other embodiments.

Returning to the count update circuit 456, in some embodiments, the count update circuit 456 may reset a count value XCount to an initial value (e.g., '0') responsive to an active RHR_TRIG signal. Thus, once a word line is determined to be an aggressor word line, the count value associated with the word line may be reset in some embodiments.

In some embodiments, the updated count value from the count update circuit 456 stored in the count value register 452 may not be written back to the count value memory cells of the word line until a precharge command is received and/or the ACT signal is inactive. In other embodiments, the updated count value may be written back to the count value memory cell after being received by the count value register 452 without regard to the receipt of a precharge command (e.g., before, during, or after the precharge command) and/or the state of the ACT signal.

In embodiments where the updated count value is written back to the count value memory cells of the word line without regard to the precharge command, there is a possibility that the count value written to the count value memory cells may be corrupted if the precharge command occurs while the count value is being written back to the count value memory cells. Thus, the next time the word line is activated and the count value XCount is provided to the count value register 452, the count value may be invalid. That is, the count value may no longer reflect the number of times the word line has been accessed.

As will be described in more detail with reference to FIG. 5, in these embodiments, the count value memory cells may implement multiple counters Counter0-N. In these embodiments, the count control circuit 428 may include the count inference circuit 460. The count inference circuit 460 may receive the count values XCount0-N stored in the count value register 452. Based at least in part, on the relative counts of the count values XCount0-N, the count inference circuit 460 may determine what the access count value of the word line is. In some embodiments, the count inference circuit 460 may determine the access count value even if one of the count values is corrupted (e.g., invalid). The count inference circuit 460 may provide the correct count value back to the count value register 452, and the correct count value may be updated by the count update circuit 456.

Optionally, in some embodiments, some of the count value memory cells may include error correction code (ECC) information ECC0-N (e.g., Hamming code information, parity bits) which may be used to correct errors in the count value provided by the remaining count value memory cells of a counter. In these embodiments, the count values XCount and ECC information are provided to the error correction circuit 462. The error correction circuit 462 may analyze the XCount and ECC information and correct errors in the XCount. The corrected XCount may then be provided to the count value register 452. When the count value register 452 provides updated count values to be written back to the count value memory cells, the error correction circuit 462 may calculate ECC information to be stored in the count value memory cells that store the ECC information for the count value.

Although the count control circuit 428 is shown as having multiple components, in some embodiments, one or more of the components may be combined and/or omitted. For example, in some embodiments, the count value register 452 and count update circuit 456 may be combined. In another example, the count inference circuit 460 may be omitted if count values are written back to the count value memory cells after the precharge command is received.

As noted above, in some embodiments, updated count values may not be provided from the count control circuit to count value memory cells of a word line until a precharge command is received. In some of these embodiments, the count value memory cells may implement a single counter. Implementing a single counter may reduce a number of memory cells of a word line that are used for count value memory cells. In some applications, this may reduce layout area of the memory array and/or reduce the number of memory cells unavailable to store data provided by an external component (e.g., memory controller 101). However, waiting for the precharge command may increase the row precharge time (tRP) of the memory because time must be provided after the precharge command for writing the updated count values back to the count value memory cells. Increasing the tRP may increase the delay between issuing the precharge command and performing an access operation on another word line. Thus, the operational throughput of the memory may be reduced.

In other embodiments, the count value may be written back to the count value memory cells without regard to the precharge command, which may cause an increase in the row active time (tRAS). However, an increase in tRAS may cause less of an impact on operation throughput of the memory compared to an increase in tRP. However, as previously discussed, writing back count values at any time may lead to a risk of the count values being corrupted. Thus, multiple counters may be used for each word line to reduce the risk of corrupting the access count value. In some embodiments, after an initial setting of the access count value, one of the multiple counters may be updated at a time. Thus, in this manner, only one of the counters is likely to be corrupted if a precharge command is received when the access count value is written back to the count value memory cells. The next time the word line is accessed, the two uncorrupted count values may be used to infer the correct or approximate access count value for the word line. This technique may use a greater number of count value memory cells than when only one counter is implemented (e.g., 40 cells versus 10 cells) in some embodiments. However, in some applications, disadvantages of the increased number of count value memory cells may be offset by the reduced operation timing impact.

FIG. 5 illustrates an example implementation of multiple counters for a word line according to an embodiment of the present disclosure. In the example shown, count value memory cells for the word line implement three counters Counter0-2. However, other numbers of counters may be used in other examples. Each of the counters Counter0-2 may be implemented by one or more count value memory cells of the word line. The counters Counter0-2 may be implemented by count value memory cells 126, 226, 326, and/or 426 in some embodiments.

Initially, when a word line is accessed (e.g., read operation, write operation), the values of the counters Counter0-2 may be provided to a count value register (e.g., count value register 452) of a count control circuit (e.g., count control circuit 128, 328, and/or 428). Responsive to the initial activation of the word line, the count control circuit may determine an access count value for the word line and update the count value of all of the counters Counter0-2. In some embodiments, the access count value may be determined based, at least in part, on the relative values stored in the counters, as will be described in more detail below. The updated count value may be compared to a threshold value (e.g., threshold comparator 454). If the updated count value is below the threshold value, the updated count value is written back to the counters Counter0-2, and thus the counters Counter0-2 store the same access count value of X for the word line after the initial update (e.g., initial increment). If the updated count value is equal to or above the threshold value, the counter control circuit may activate a signal (e.g., RHR_TRIG) and/or reset the count value of all of the counters.

The count control circuit may further update the count value for the word line responsive to a length of time the word line remains activated (e.g., count update circuit 456 and/or timer circuit 458). However, to reduce the risk of corrupting the count value, the count control circuit may only provide the updated count value to one of the counters to write back. For example, after the word line has been activated for a first period of time, the count control circuit may update the count value for the word line and the updated count value may be written back to Counter0. In the example shown in FIG. 5, the count value is updated by incrementing by one. Thus, after the first period of time, the value stored in Counter0 is X+1 while the value stored in Counter1 and Counter2 remain X. After the word line has been activated for a second period of time, the count control circuit may update the count value for the word line and the updated count value may be written back to Counter1. After the second period of time, the value stored in Counter1 is X+2 while the value stored in Counter0 remains X+1 and the value stored in Counter2 remains X. After the word line has been activated for a third period of time, the count control circuit may update the count value for the word line and the updated count value may be written back to Counter2. After the third period of time, the value stored in Counter2 is X+3 while the value stored in Counter0 remains X+1 and the value stored in Counter1 remains X+2. As shown in FIG. 5, if the word line remains activated for additional periods, the count control circuit continues to increment the count value for the word line and write it back to one of the three counters Counter0-2 in the same sequence until the word line is deactivated (e.g., a precharge command is received, the activation signal ACT is deactivated).

Although not shown in FIG. 5, every time the count control circuit updates the count value, the updated count value may be compared to the threshold value. If after one of the updates (e.g., increments shown in FIG. 5), the count value is equal to or greater than the threshold value, the sequence illustrated in FIG. 5 may stop. For example, one or more of Counters0-2 may be reset, the address of the word line may be captured, access of word lines may be interrupted, and/or a targeted refresh operation may be initiated.

The next time the word line is activated, the values of the counters Counter0-2 may again be provided to the count control circuit. The count control circuit may analyze the relative values stored in the counters to determine the access count value for the word line (e.g., count inference circuit 460). Once the count value is determined, the count control circuit may increment the count value and write it back to all of the counters Counter0-2 as discussed above.

Since only one counter is updated at a time, only one of the multiple counters is at risk of having the stored count value corrupted (e.g., due to the receipt of a precharge command). Furthermore, because the count value is updated by a known amount for each time period (e.g., 1 in the example shown in FIG. 5) and the counters Count0-2 are written back to in a known sequence (e.g., Counter0->Counter1->Counter2 in the example shown in FIG. 5), the relative values of two of the count values stored in the counters Count0-2 may be used to determine the count value for the word line, even if a count value stored in one of the counters Count0-2 is invalid (e.g., corrupted due to receipt of a precharge command while the count value was being written to the counter).

In the 3-counter example where each counter is sequentially incremented by 1 shown in FIG. 5, the inferences from the values stored in the counters to determine the access count value for the word line is shown:

Inference 1: If all three counters have the same value X, then the correct count value for the word line is X.

Inference 2: If only two of the counters have the same value X, then the correct count value for the word line is X+1, regardless of the count value of the other counter.

Inference 3: If two counters have values of X and X+1 and the third counter has a value of X−1, then the correct count value for the word line is X+1.

Inference 4: If two counters have values of X and X+1 and the third counter has a value other than X (see Inference 2) or X−1, then the correct count is X+2 regardless of the value of the third counter.

When a count value is corrupted during writing back to a counter, the value stored in the counter may be random. In rare instances, a count value may be corrupted in such a way that makes it difficult to determine whether the count value has been corrupted or not. For example, returning to FIG. 5, during the first period, the value of Counter0 may be corrupted such that X is written to Counter0 instead of X+1. In this case, when the word line is accessed again, the count inference circuit may determine the correct count value is X rather than X+1. However, in these rare cases, the count value is only off by a single update (e.g., increment by one in the example shown in FIG. 5). This error is acceptable if it is rare because the threshold value is much higher than the amount by which a counter is updated. For example, the threshold value may be 100, 500, 1,000, 2,000, and/or 5,000 accesses and/or equivalent activation time (e.g., holding the row open) whereas updating the count value may increment the count value by one. Thus, the error is typically less than 1%.

The count control circuit may include logic to implement the inferences above for determining the access count value from the values stored in the counters (e.g., count inference circuit 460).

In other embodiments, other numbers of counters, counter sequence for updating, and/or updating method (e.g., decrement by 5) may be used. So long as the parameters are known, a set of inferences may be generated based on the relative values in the counters to determine the access count value for the word line.

Figure 6:
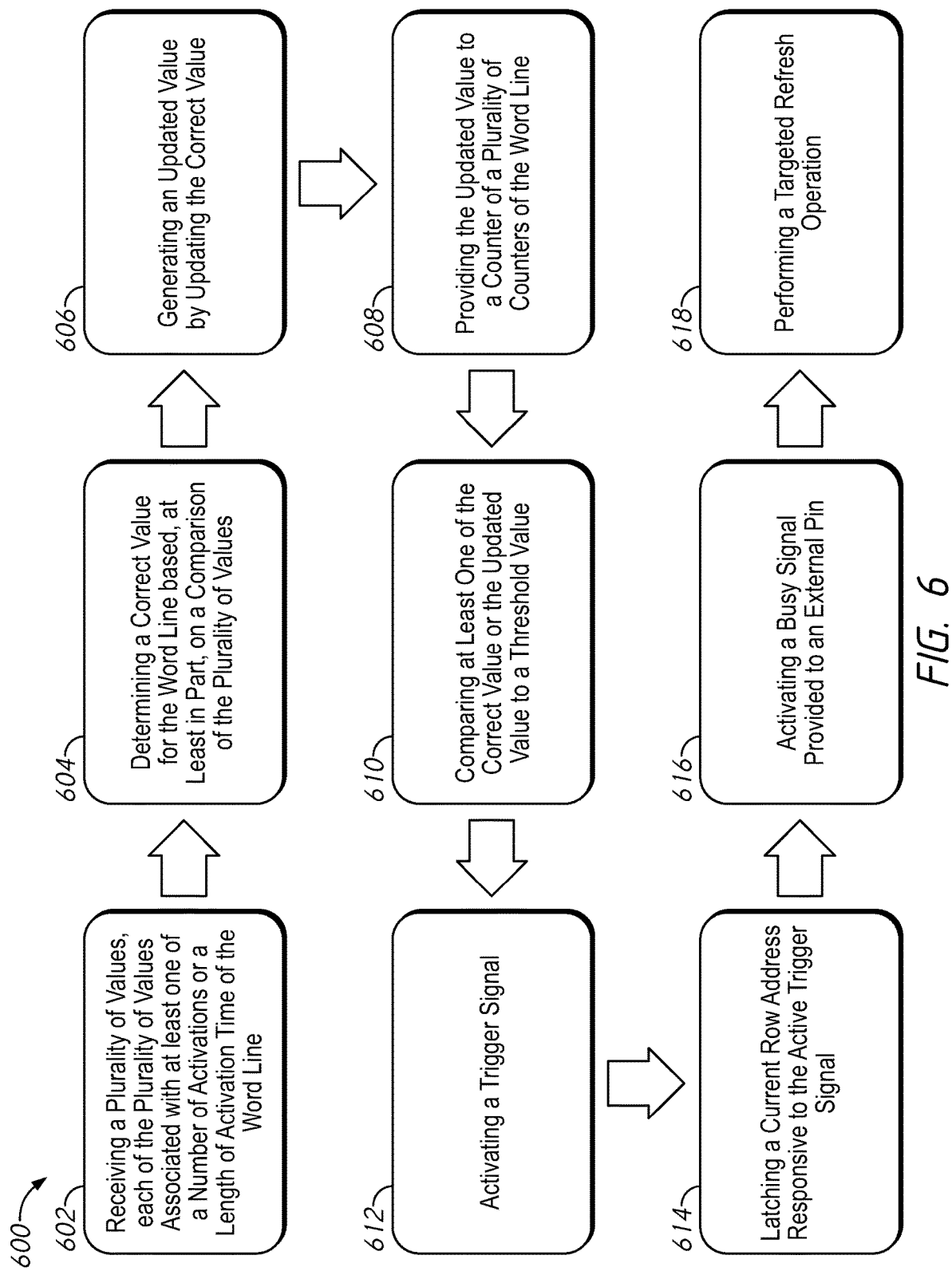
FIG. 6 is a flow chart of a method according to an embodiment of the present disclosure.

FIG. 6 is a flow chart of a method according to an embodiment of the present disclosure. The method shown in flow chart 600 may be performed by the components shown in FIG. 1 and/or FIG. 3 in some embodiments. The method shown in flow chart 600 may be performed, at least in part, by the count control circuit shown in FIG. 4 in some embodiments.

Responsive to an activation of a word line, at block 602, "receiving a plurality of values, each of the plurality of values associated with at least one of a number of activations or a length of activation time of the word line" may be performed. In some embodiments, the values may be received by a count control circuit, such as count control circuit 128, 328, and/or 428. The values may be received from count value memory cells included with the word line, such as count value memory cells 126, 226, 326, and/or 426 in some embodiments. In some embodiments, the count values may be stored in one or more registers, such as count value register 452.

At block 604, "determining a correct value for the word line based, at least in part, on a comparison of the plurality of values." In some embodiments, this may be performed by a count inference circuit, such as count inference circuit 460 included in the count control circuit.

At block 606, "generating an updated value by updating the correct value" may be performed. In some embodiments, this may be performed by a count update circuit, such as count update circuit 456. In some embodiments, updating the correct value may include incrementing the correct value. In some embodiments, the updating is performed each time the word line remains activated for an interval of time. For example, a timer, such as timer circuit 458 may measure a length an activation signal is active.

At block 608, "providing the updated value to a counter of a plurality of counters of the word line" may be performed. In some embodiments, the updated value is provided each time the updating is performed. In some embodiments, the updated value may be provided regardless of a state of an activation and/or precharge signal.

In some embodiments, the method may further include block 610 where "comparing at least one of the correct value or the updated value to a threshold value" may be performed. In some embodiments, the comparing may be performed by a threshold comparator, such as threshold comparator 454. When the correct value or the updated value is equal to or exceeds the threshold value, "activating a trigger signal" may be performed at block 612. In some embodiments, the method may further include resetting the correct value or the updated value when the correct value or the updated value is equal to or exceeds the threshold value.

In some embodiments, the method may further include "latching a current row address responsive to the active trigger signal" at block 614. In some embodiments, the latching may be performed by a refresh control circuit, such as refresh control circuit 116 and/or 316. At block 616, "activating a busy signal provided to an external pin" may be performed. At block 616, "performing a targeted refresh operation" may be performed. The activating and performing may be performed by the refresh control circuit in some embodiments.

Although blocks 610-618 are shown after block 608, in some embodiments, at least some of blocks 610-618 may be performed before or during performance of block 608. For example, block 610 may be performed before and after block 608 in some embodiments.

The apparatuses and methods disclosed herein may provide a deterministic technique for detecting various memory attacks, such as row hammer and clobber attacks. At least some of the apparatuses and methods disclosed herein may allow for tracking a number of activations and/or time of activation of word lines. Tracking values may be stored in count value memory cells associated with individual word lines. In some embodiments, the tracking values may be written back to the count value memory cells without waiting for a precharge command, which may minimize impact on tRP and/or other memory operation timing parameters. In some embodiments, the memory may alert an external device, such as a controller, when a targeted refresh is being performed, which may permit targeted refresh operations to be performed outside scheduled refresh modes.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory array comprising a plurality of word lines, wherein each of the plurality of word lines comprises a plurality of counters each configured to separately store a value representing a number of activations and an amount of time of activation of a corresponding one of the plurality of word lines, wherein each of the plurality of counters comprises at least one count value memory cell; and
a count control circuit configured to receive the values from the plurality of counters of a word line of the plurality of word lines when the word line is activated, update at least one of the values, and provide at least one updated value to at least one of the plurality of counters.

2. The apparatus of claim 1, wherein the plurality of counters are further configured to store error correction code (ECC) information associated with the value.

3. The apparatus of claim 2, wherein the count control circuit includes an error correction circuit configured to receive the ECC information, use the ECC information to correct errors in the value, and generate further ECC information associated with the updated value.

4. The apparatus of claim 1, wherein the count control circuit comprises a timer to count how long the word line remains at an activation voltage.

5. The apparatus of claim 1, wherein the count control circuit comprises a timer to count how long an activation signal is active.

6. The apparatus of claim 1, wherein the count control circuit is further configured to update the at least one value for each of a plurality of time intervals the word line is activated.

7. The apparatus of claim 1, wherein the count control circuit is configured to compare the values from the plurality of counters to one another, determine a correct value, and update the correct value to generate the at least one updated value.

8. The apparatus of claim 1, wherein the count control circuit is further configured to compare the value to a threshold value and activate a trigger signal when the value is equal to or greater than the threshold value.

9. A method comprising:
responsive to an activation of a word line, receiving a plurality of values, each of the plurality of values representing a number of activations, a length of activation time of the word line, or a combination thereof, wherein each of the plurality of values are provided by a corresponding one of a plurality of counters of the word line;
determining a correct value for the word line based, at least in part, on a comparison of the plurality of values to one another;
generating an updated value by updating the correct value; and
providing the updated value to a counter of thee, plurality of counters of the word line.

10. The method of claim 9, wherein updating the correct value comprises incrementing the correct value.

11. The method of claim 9, wherein the updating is performed each time the word line remains activated for an interval of time.

12. The method of claim 11, wherein the updated value is provided each time the updating is performed.

13. The method of claim 9, further comprising comparing at least one of the correct value or the updated value to a threshold value; and
    when the cornea value or the updated value is equal to or exceeds the threshold value, activating a trigger signal.

14. The method of claim 13, further comprising resetting the correct value or the updated value when the correct value or the updated value is equal to or exceeds the threshold value.

15. The method of claim 13, further comprising latching a current row address responsive to the active trigger signal.

16. The method of claim 15, further comprising:
    activating a busy signal provided to an external pin; and
    performing a targeted refresh operation.

* * * * *

UNITED STATES PATENT AND TRADEMARK OFFICE
CERTIFICATE OF CORRECTION

PATENT NO. : 11,462,291 B2
APPLICATION NO. : 17/102266
DATED : October 4, 2022
INVENTOR(S) : Dong Pan It is certified that error appears in the above-identified patent and that said Letters Patent is hereby corrected as shown below:

In the Claims

| Column | Line | Claim | Reads | Should Read |
|---|---|---|---|---|
| 22 | 64 | 9 | a counter of thee, plurality of counters | a counter of the plurality of counters |
| 23 | 9 | 13 | when the cornea value or the updated value | when the correct value or the updated value |

Signed and Sealed this
Twentieth Day of December, 2022

Katherine Kelly Vidal
*Director of the United States Patent and Trademark Office*